(12) United States Patent
Miskiewicz et al.

(10) Patent No.: US 9,331,281 B2
(45) Date of Patent: May 3, 2016

(54) BANK STRUCTURES FOR ORGANIC ELECTRONIC DEVICES

(71) Applicants: Merck Patent GmbH, Darmstadt (DE); Promerus LLC, Brecksville, OH (US)

(72) Inventors: Pawel Miskiewicz, Cambridge, MA (US); Tomas Backlund, Southampton (GB); Philip Edward May, Sidcup (GB); Toby Cull, Romsey (GB); Larry F. Rhodes, Silver Lake, OH (US); Edmund Elce, Lakewood, OH (US); Andrew Bell, Lakewood, OH (US)

(73) Assignees: Merck Patent GmbH, Darmstadt (DE); Promerus, LLC, Brecksville, OH (US)

( * ) Notice: Subject to any disclaimer, the term of this patent is extended or adjusted under 35 U.S.C. 154(b) by 320 days.

(21) Appl. No.: 13/869,436

(22) Filed: Apr. 24, 2013

(65) Prior Publication Data

US 2013/0285026 A1    Oct. 31, 2013

Related U.S. Application Data

(60) Provisional application No. 61/637,988, filed on Apr. 25, 2012.

(30) Foreign Application Priority Data

Apr. 26, 2012    (EP) .................................... 12002925

(51) Int. Cl.
   *H01L 29/786*    (2006.01)
   *H01L 29/04*    (2006.01)
   (Continued)

(52) U.S. Cl.
   CPC ............ *H01L 51/0035* (2013.01); *C08G 61/08* (2013.01); *C08L 65/00* (2013.01); *H01L 27/3246* (2013.01); *H01L 27/3283* (2013.01); *H01L 51/0034* (2013.01); *H01L 51/0545* (2013.01)

(58) Field of Classification Search
   CPC ............ H01L 51/0034; H01L 51/0035; H01L 51/0545; H01L 27/3246; H01L 27/3283; C08G 61/08; C08L 65/00
   USPC ...................... 257/40, 57, 618, 737, E51.001, 257/E51.002, E29.003, E29.022, E21.511, 257/E21.615; 438/22, 99, 197; 526/266, 526/273, 281; 252/500; 430/281.1, 319, 430/323
   See application file for complete search history.

(56) References Cited

U.S. PATENT DOCUMENTS 3,622,321 A    11/1971    Smets et al.
5,468,819 A    11/1995    Goodall et al.
(Continued)

FOREIGN PATENT DOCUMENTS

EP    1933393 A1    6/2008
GB    2458454 A    9/2009
(Continued)

*Primary Examiner* — Dao H Nguyen
(74) *Attorney, Agent, or Firm* — Drinker Biddle & Reath LLP

(57) ABSTRACT

Embodiments in accordance with the present invention relate generally to the use of polycycloolefinic polymers as a structure defining material in organic electronic devices, and more specifically to separators, insulating structures or bank structures of such devices and to organic electronic devices comprising such structures, to processes for preparing such structures and to organic electronic devices encompassing such structures.

27 Claims, 8 Drawing Sheets

(51) Int. Cl.
*H01L 21/8234* (2006.01)
*H01L 51/00* (2006.01)
*H01L 51/05* (2006.01)
*C08G 61/08* (2006.01)
*C08L 65/00* (2006.01)
*H01L 27/32* (2006.01)

(56) References Cited

U.S. PATENT DOCUMENTS

| | | | |
|---|---|---|---|
| 6,538,087 | B2 | 3/2003 | Zhao et al. |
| 6,630,566 | B1 | 10/2003 | Allen et al. |
| 6,690,029 | B1 | 2/2004 | Anthony et al. |
| 6,967,436 | B2 | 11/2005 | Park |
| 7,385,221 | B1 | 6/2008 | Anthony et al. |
| 8,053,515 | B2 | 11/2011 | Elce et al. |
| 2003/0017360 | A1 | 1/2003 | Tai et al. |
| 2006/0020068 | A1 | 1/2006 | Elce et al. |
| 2007/0023837 | A1 | 2/2007 | Lee et al. |
| 2007/0066775 | A1 | 3/2007 | Rhodes et al. |
| 2007/0102696 | A1 | 5/2007 | Brown et al. |
| 2007/0190673 | A1 | 8/2007 | Ko et al. |
| 2008/0193877 | A1* | 8/2008 | Kim et al. ................ 430/281.1 |
| 2008/0194740 | A1 | 8/2008 | Elce et al. |
| 2009/0042346 | A1* | 2/2009 | Kugler ........................ 438/197 |
| 2009/0098680 | A1 | 4/2009 | Tsai et al. |
| 2010/0090204 | A1 | 4/2010 | Chuman et al. |
| 2011/0101317 | A1 | 5/2011 | Gregory et al. |
| 2011/0180907 | A1* | 7/2011 | McConnell .................... 257/618 |
| 2012/0056183 | A1* | 3/2012 | Mueller et al. ................ 257/57 |
| 2012/0056249 | A1* | 3/2012 | Mueller et al. ................ 257/288 |

FOREIGN PATENT DOCUMENTS

| | | |
|---|---|---|
| GB | 2462845 A | 2/2010 |
| WO | WO-03/079458 A1 | 9/2003 |
| WO | WO-2005/055248 A2 | 6/2005 |
| WO | WO-2007023272 A1 | 3/2007 |
| WO | WO-2008/070774 A1 | 6/2008 |
| WO | WO-2008117395 A1 | 10/2008 |
| WO | WO-2009077738 A1 | 6/2009 |
| WO | WO-2009/112569 A1 | 9/2009 |
| WO | WO-2010/020790 A1 | 2/2010 |
| WO | PCT/EP2011/004281 | 3/2012 |
| WO | PCT/EP2011/004282 | 3/2012 |
| WO | WO-2012028278 A1 | 3/2012 |
| WO | WO-2012028279 A1 | 3/2012 |

* cited by examiner

BANK STRUCTURES FOR ORGANIC ELECTRONIC DEVICES

CROSS-REFERENCE TO RELATED APPLICATIONS

This application claims benefit (under 35 USC 119(e)) of U.S. Provisional Application 61/637,988, filed Apr. 25, 2012, and European Patent Application No. 12002925.1, filed Apr. 26, 2012, both of which are incorporated by reference.

TECHNICAL FIELD

Embodiments in accordance with the present invention relate generally to the use of polycycloolefinic polymers as a structure defining material in organic electronic devices, and more specifically to separators, insulating structures or bank structures of such devices and to organic electronic devices comprising such structures, to processes for preparing such structures and to organic electronic devices encompassing such structures.

BACKGROUND

In order to improve the performance of organic electronic (OE) devices, such as organic field effect transistors (OFETs) or organic light emitting diodes (OLEDs), it is desirable to be able to deposit, from a solution, the individual functional layers, for example the semiconductor layer, in a specific, confined place on a substrate.

Bank structures, and methods of forming them, are known to be used for defining such confined places on a substrate. For example, US 2007/0023837 A1, WO 2008/117395 A1, EP 1 933 393 A1, GB 2,458,454 A, GB 2,462,845 A, US 2003/017360 A1, US 2007/190673 A1, WO 2007/023272 A1 and WO 2009/077738 A1 individually and collectively are representative disclosures of such known structures and methods. However, despite these disclosures, none provide a manufacturing process or material that is compatible with ink-jet printing or photolithography, or that discloses a solution processable material that is useable without harmful reactive or migrating chemicals or methods.

Thus it would be desirable to provide structure defining materials for use in forming bank structures that are compatible with ink-jet printing or photolithography which are essentially free of the aforementioned harmful reactive or migrating chemicals. Additionally it would be desirable to provide methods of forming such bank structures using methods that are both compatible with ink-jet printing or photolithography and do not require the use of processes such as halocarbon reactive ion etching. Still further it would be desirable to provide OE devices manufactured using such desirable structure defining materials and structure forming methods.

SUMMARY

Embodiments in accordance with the present invention encompass an organic electronic device comprising one or more defined structures, like separators, insulating structures or bank structures, wherein said defined structures comprise a polycycloolefinic polymer.

Some embodiments in accordance with the present invention encompass polycycloolefinic polymers for use as structure defining material in organic electronic devices, for example in separators, insulating structures or bank structures of such devices.

Some embodiments in accordance with the present invention encompass defined structures like insulating structures or bank structures in an organic electronic device, wherein said defined structure comprise a polycycloolefinic polymer.

Some embodiments in accordance with the present invention are also directed to the use of the aforementioned defined structures in an organic electronic device.

The aforementioned organic electronic device is for example an Organic Field Effect Transistor (OFET), including Organic Thin Film Transistors (OTFT), an Organic Light Emitting Diode (OLED) or an Organic Photovoltaic (OPV) device, especially a top gate OFET or bottom gate OFET.

Embodiments of the present invention are also inclusive of a product or an assembly comprising an organic electronic device as described above and below. Such product or assembly being an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a sensor, a biosensor or a biochip.

The invention further relates to a process of preparing an organic electronic device, like a top gate OFET or bottom gate OFET, comprising one or more bank structures as described hereinafter.

BRIEF DESCRIPTION OF THE DRAWINGS

Embodiments of the invention are described below with reference to the following drawings.

DETAILED DESCRIPTION

Figure 1:
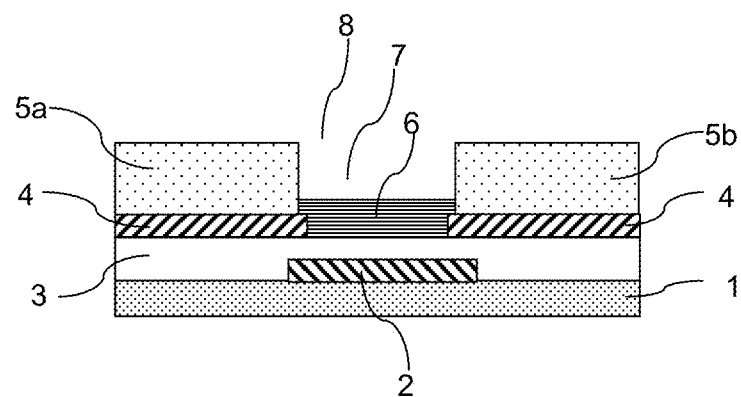
FIG. 1 is a schematic representation of a bottom gate OFET device in accordance with the present invention.

As used herein, the term Organic Field Effect Transistors (OFET) will be understood to be inclusive of the subclass of such devices known as Organic Thin Film Transistors (OTFTs).

In addition, it will be understood that the terms "dielectric" and "insulating" are used interchangeably herein. Thus reference to an insulating material or layer is inclusive of a dielectric material or layer and vice versa. Further, as used herein, the term "organic electronic device" will be understood to be inclusive of the term "organic semiconductor device" and the several specific implementations of such devices such as the OFETs as defined above.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the terms "insulating structure(s)" and "bank structure(s)" will be understood to mean a patterned structure, for example a patterned layer, that is provided on an underlying substrate and defines a specific structure, for example a well, on said substrate that can be filled by a functional material like a semiconductor or a dielectric. The patterned structure comprises a structure defining material that is selected such that a surface energy contrast is created between said patterned structure and said substrate. Usually the substrate has a higher surface energy while the patterned structure has a lower surface energy. The substrate is for example a functional layer of an electronic device, like an electrode, a semiconducting layer or a dielectric layer. The insulating structure or bank structure is used to define more easily the active area of a solution-processed thin film of, for example, the semiconductor in an electronic device, by using the tendency of the liquid solution to move and stick to the area having higher surface energy, i.e., the substrate. By confining the liquid in a given area, a thin film can be formed as needed in the specific device application. This provides certain benefits, for example in OFETs the confined area of organic semiconductor improves the off-state current. It will be understood that the terms "bank structure(s)" and "insulating structure(s)" are used interchangeably herein. Thus reference to a bank structure is inclusive of an insulating structure.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the term "polymer composition" means at least one polymer and one or more other materials added to the at least one polymer to provide, or to modify, specific properties of the polymer composition and or the at least one polymer therein. It will be understood that a polymer composition is a vehicle for carrying the polymer to a substrate to enable the forming of layers or structures thereon. Exemplary materials include, but are not limited to, solvents, antioxidants, photoinitiators, photosensitizers, crosslinking moieties or agents, reactive diluents, acid scavengers, leveling agents and adhesion promoters. Further, it will be understood that a polymer composition may, in addition to the aforementioned exemplary materials, also encompass a blend of two or more polymers.

As defined herein, the terms "polycycloolefin", "polycyclic olefin", and "norbornene-type" are used interchangeably and refer to addition polymerizable monomers, or the resulting repeating unit, encompassing at least one norbornene moiety such as shown by either Structure A1 or A2, below. The simplest norbornene-type or polycyclic olefin monomer bicyclo[2.2.1]hept-2-ene (A1) is commonly referred to as norbornene.

(A1)

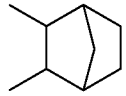

(A2)

However, the term "norbornene-type monomer" or "norbornene-type repeating unit", as used herein, is understood to not only mean norbornene itself but also to refer to any substituted norbornene, or substituted and unsubstituted higher cyclic derivatives thereof, for example of Structures B1 and B2, shown below, wherein m is an integer greater than zero.

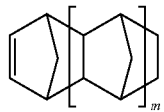

(B1)

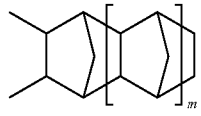

(B2)

By the substitution of a norbornene-type monomer with a pendent group, the properties of a polymer formed therefrom can be tailored to fulfill the needs of individual applications. The procedures and methods that have been developed to polymerize functionalized norbornene-type monomers exhibit an outstanding flexibility and tolerance to various moieties and groups of the monomers. In addition to polymerization of monomers with a specific pendent group, monomers having a variety of distinct functionalities can be randomly polymerized to form a final material where the types and ratios of monomers used dictate the overall bulk properties of the resulting polymer.

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, or I). The term perhalocarbyl refers to a hydrocarbyl group where each hydrogen has been replaced by a halogen. Non-limiting examples of hydrocarbyls, include, but are not limited to a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. Representative alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include but are not limited to vinyl, propenyl, butenyl and hexenyl. Representative alkynyl groups include but are not limited to ethynyl, 1-propynyl, 2-propynyl, 1 butynyl, and 2-butynyl. Representative cycloalkyl groups include but are not limited to cyclopentyl, cyclohexyl, and cyclooctyl substituents. Representative aryl groups include but are not limited to phenyl, biphenyl, naphthyl, and anthracenyl. Representative aralkyl groups include but are not limited to benzyl, phenethyl and phenbutyl.

The term "halohydrocarbyl" as used herein is inclusive of the hydrocarbyl moieties mentioned above but where there is a degree of halogenation that can range from at least one hydrogen atom being replaced by a halogen atom (e.g., a fluoromethyl group) to where all hydrogen atoms on the hydrocarbyl group have been replaced by a halogen atom (e.g., trifluoromethyl or perfluoromethyl), also referred to as perhalogenation. For example, halogenated alkyl groups that can be useful in embodiments of the present invention can be partially or fully halogenated, alkyl groups of the formula $C_aX_{2a+1}$ wherein X is independently a halogen or a hydrogen and a is selected from an integer of 1 to 25. In some embodiments each X is independently selected from hydrogen, chlorine, fluorine bromine and/or iodine. In other embodiments each X is independently either hydrogen or fluorine. Thus, representative halohydrocarbyls and perhalocarbyls are exemplified by the aforementioned exemplary hydrocarbyls where an appropriate number of hydrogen atoms are each replaced with a halogen atom.

In addition, the definition of the terms "hydrocarbyl", "halohydrocarbyl", and "perhalohydrocarbyl", are inclusive of moieties where one or more of the carbon atoms is replaced by a heteroatom selected independently from O, N, P, or Si. Such heteroatom containing moieties can be referred to as, for example, either "heteroatom-hydrocarbyls" or "heterohydrocarbyls", including, among others, ethers, epoxies, glycidyl ethers, alcohols, carboxylic acids, esters, maleimides, amines, imines, amides, phenols, amido-phenols, silanes, siloxanes, phosphines, phosphine oxides, phosphinites, phosphonites, phosphites, phosphonates, phosphinates, and phosphates.

Further exemplary hydrocarbyls, halohydrocarbyls, and perhalocarbyls, inclusive of heteroatoms, include, but are not limited to, $-(CH_2)_n-Ar-(CH_2)_n-C(CF_3)_2-OH$, $-(CH_2)_n-Ar-(CH_2)_n-OCH_2C(CF_3)_2-OH$, $-(CH_2)_n-C(CF_3)_2-OH$, $-((CH_2)_i-O-)_k-(CH_2)-C(CF_3)_2-OH$, $-(CH_2)_n-C(CF_3)(CH_3)-OH$, $-(CH_2)_n-C(O)NHR^*$, $-(CH_2)_n-C(O)Cl$, $-(CH_2)_n-C(O)OR^*$, $-(CH_2)_n-OR^*$, $-(CH_2)_n-OC(O)R^*$ and $-(CH_2)_n-C(O)R^*$, where n independently represents an integer from 0 to 12, i is 2, 3 or 4, k is 1, 2 or 3, Ar is aryl, for example phenyl, and R* independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl.

Exemplary perhalogenated alkyl groups include, but are not limited to, trifluoromethyl, trichloromethyl, $-C_2F_5$, $-C_3F_7$, $-C_4F_9$, $C_6F_{13}$, $-C_7F_{15}$, and $-C_{11}F_{23}$. Exemplary halogenated or perhalogenated aryl and aralkyl groups include, but are not limited to, groups having the formula $-(CH_2)_x-C_6F_yH_{5-y}$, and $-(CH_2)_x-C_6F_yH_{4-y}-pC_zF_qH_{2z+1-q}$, where x, y, q and z are independently selected integers from 0 to 5, 0 to 5, 0 to 9 and 1 to 4, respectively.

Specifically, such exemplary halogenated or perhalogenated aryl groups include, but are not limited to, pentachlorophenyl, pentafluorophenyl, pentafluorobenzyl, 4-trifluoromethylbenzyl, pentafluorophenethyl, pentafluorophenpropyl, and pentafluorophenbutyl.

The polycycloolefinic polymers as used in the bank structures of the present invention are for example norbornene-type polymers.

In some polymer embodiments in accordance with the invention, the norbornene-type polymers incorporate two or more distinct types of repeating units.

In other polymer embodiments in accordance with the invention, the norbornene-type polymers incorporate one or more distinct types of repeating units, where at least one such type of repeating unit encompasses pendent crosslinkable groups or moieties that have some degree of latency. By "latency", it is meant that such groups do not crosslink at ambient conditions or during the initial forming of the polymers, but rather crosslink when such reactions are specifically initiated, for example by actinic radiation or heat. Such latent crosslinkable groups are incorporated into the polymer backbone by, for example, providing one or more norbornene-type monomers encompassing such a pendent crosslinkable group, for example, a substituted or unsubstituted maleimide or maleimide containing pendent group, to the polymerization reaction mixture and causing the polymerization thereof. Preferred crosslinkable groups include a group comprising a substituted or unsubstituted maleimide portion, an epoxide portion, a vinyl portion, an acetyl portion, an indenyl portion, a cinnamate portion or a coumarin portion, and more specifically a group selected from a 3-monoalkyl- or 3,4-dialkylmaleimide, epoxy, vinyl, acetylene, cinnamate, indenyl or coumarin group.

Other polymer embodiments in accordance with the invention contain one or more norbornene-type polymers having one or more distinct types of repeating units of Formula I

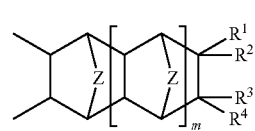

(I)

wherein Z is selected from $-CH_2-$, $-CH_2-CH_2-$ or $-O-$, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group.

The repeating units of Formula I are formed from the corresponding norbornene-type monomers of Formula Ia where Z, m and $R^{1-4}$ are as defined above:

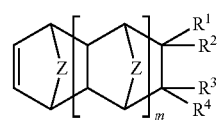

(Ia)

For some polymer embodiments in accordance with the present invention, for the repeating units and monomers of Formula I and Ia, Z is $-CH_2-$ and m is 0, 1 or 2. For other such embodiments Z is $-CH_2-$ and m is 0 or 1, and for still other embodiments Z is $-CH_2-$ and m is 0.

Polymer composition embodiments in accordance with the invention encompass either a single norbornene-type polymer or a blend of two or more different norbornene-type polymers. Where such polymer composition embodiments encompass a single norbornene-type polymer, such polymer can be a homopolymer, that is to say a polymer encompassing only one type of repeating unit, or a copolymer, that is to say a polymer encompassing two or more distinct types of repeating units. Where such polymer composition embodiments encompass a blend of different polymers, "different" is understood to mean that each of the blended polymers encompasses at least one type of repeating unit, or combination of repeating units, that is distinct from any of the other blended polymers.

Other polymer composition embodiments of the invention encompass a blend of two or more different norbornene-type polymers, wherein each polymer comprises one or more distinct types of repeating units of formula I

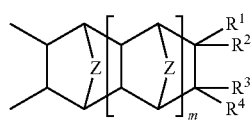

wherein Z is selected from $-CH_2-$, $-CH_2-CH_2-$ or $-O-$, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group.

The polymer and polymer composition embodiments of the present invention can advantageously be tailored to provide a distinct set of properties for each of many specific applications. That is to say that different combinations of norbornene-type monomers with several different types of pendent groups can be polymerized to provide norbornene-type polymers having properties that provide for obtaining control over properties such as flexibility, adhesion, dielectric constant, and solubility in organic solvents, among others. For example, varying the length of an alkyl pendent group can allow control of the polymer's modulus and glass transition temperature ($T_g$). Also, pendent groups selected from maleimide, cinnamate, coumarin, anhydride, alcohol, ester, and epoxy functional groups can be used to promote crosslinking and to modify solubility characteristics. Polar functional groups, epoxy and triethoxysilyl groups can be used to provide adhesion to metals, silicon, and oxides in adjacent device layers. Fluorinated groups, for example, can be used to effectively modify surface energy, dielectric constant and influence the orthogonality of the solution with respect to other materials.

Thus, in further embodiments of the present invention, in particular for such embodiments where only one of $R^{1-4}$ is different from H, one or more of $R^{1-4}$ denote a halogenated or perhalogenated alkyl, aryl or aralkyl group including, but not limited to those of the formula $-(CH_2)_x-C_6F_yH_{5-y}$, and $-(CH_2)_x-C_6F_yH_{4-y}-pC_zF_qH_{2z+1-q}$, where x, y, q, and z are independently selected integers from 0 to 5, 0 to 5, 0 to 9, and 1 to 4, respectively, and "p" means "para". Specifically such formulae include, but are not limited to, trifluoromethyl, trichloromethyl, $-C_2F_5$, $-C_3F_7$, $-C_4F_9$, $C_6F_{13}$, $-C_7F_{15}$, $-C_{11}F_{23}$, pentachlorophenyl, pentafluorophenyl, pentafluorobenzyl, 4-trifluoromethylbenzyl, pentafluorophenylethyl, pentafluorophenpropyl, and pentafluorophenbutyl.

Further still, some embodiments of the present invention, in particular for such embodiments where only one of $R^{1-4}$ is different from H, encompass a group that is different from H that is a polar group having a terminal hydroxy, carboxy or oligoethyleneoxy moiety, for example a terminal hydroxyalkyl, alkylcarbonyloxy (for example, acetyl), hydroxy-oligoethyleneoxy, alkyloxy-oligoethyleneoxy or alkylcarbonyloxy-oligoethyleneoxy moiety, where "oligoethyleneoxy" is understood to mean $-(CH_2CH_2O)_s-$ with s being 1, 2 or 3; for example 1-(bicyclo[2.2.1]hept-5-en-2-yl)-2,5,8,11-tetraoxadodecane (NBTODD) where s is 3 and 5-((2-(2-methoxyethoxy)ethoxy)methyl) bicyclo[2.2.1]hept-2-ene (NB-TON) where s is 2.

Further still, in other embodiments of the present invention, in particular for such embodiments where only one of $R^{1-4}$ is different from H, encompass a group that is different from H that is a group having a pendent silyl group, for example a silyl group represented by $-(CH_2)_n-SiR^9_3$ where n is an integer from 0 to 12, and each $R^9$ independently represents halogen selected from the group consisting of chlorine, fluorine, bromine and iodine, linear or branched ($C_1$ to $C_{20}$)alkyl, linear or branched ($C_1$ to $C_{20}$)alkoxy, substituted or unsubstituted ($C_6$ to $C_{20}$)aryloxy, linear or branched ($C_1$ to $C_{20}$)alkyl carbonyloxy; linear or branched ($C_1$ to $C_{20}$) dialkylamido; substituted or unsubstituted ($C_6$-$C_{20}$) diarylamido; substituted or unsubstituted ($C_1$-$C_{20}$)alkylarylamido.

Further still, other embodiments of the present invention, in particular such embodiments where only one of $R^{1-4}$ is different from H and where only one of $R^{5-8}$ is different from H, encompass a group that is either a photoreactive or a crosslinkable group. Preferred photoreactive or crosslinkable groups encompass a linking portion L and a functional portion F. Preferably L denotes or comprises a group selected from $C_1$-$C_{12}$ alkyls, aralkyls, aryls or hetero atom analogs. Further preferably F denotes or comprises one or more of a maleimide, a 3-monoalkyl- or 3,4-dialkylmaleimide, epoxy, vinyl, acetylenic, cinnamate, indenyl or coumarin moiety, which is capable of a crosslinking or 2+2 crosslinking reaction.

As used herein, the phrase "photoreactive and/or crosslinkable", when used to describe certain pendent groups, will be understood to mean a group that is reactive to actinic radiation and as a result of that reactivity enters into a crosslinking reaction, or a group that is not reactive to actinic radiation but can, in the presence of a crosslinking activator, enter into a crosslinking reaction.

Exemplary repeating units that encompass a pendent photoreactive or crosslinkable group that are representative of Formula I are formed during polymerization from norbornene-type monomers that include, but are not limited to, those selected from the following formulae:

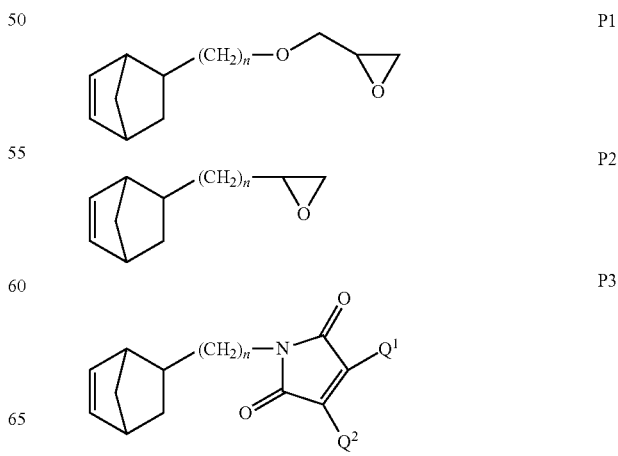

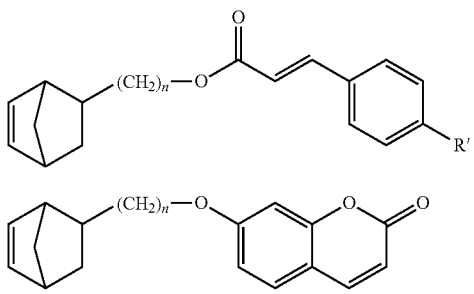

P4

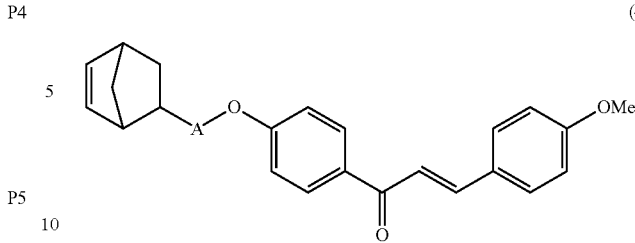

(4)

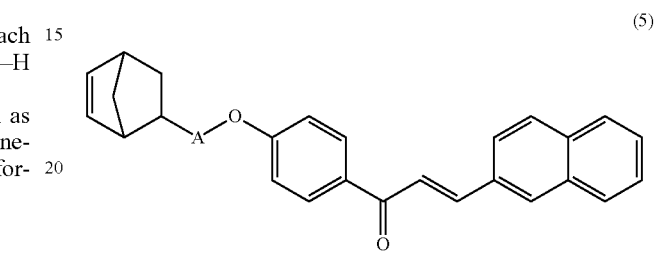

P5 where n is an integer from 1 to 8, $Q^1$ and $Q^2$ are each independently from one another —H or —CH$_3$, and R' is —H or —OCH$_3$.

Further exemplary repeating units of Formula I such as described above are derived from one or more norbornene-type monomers represented by the following structural formulae 1 through 5 below:

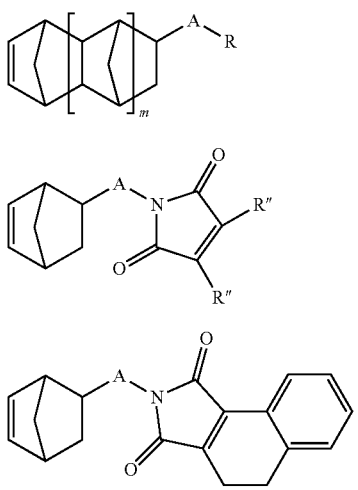

(1)

(2)

(3)

(5)

For structural formulae 1-5 above, m is an integer from 0 to 3, A is a connecting, spacer or bridging group selected from $(CZ_2)_6$, $(CH_2)_n$—$(CH=CH)_p$—$(CH_2)_6$, $(CH_2)_n$—O—$(CH_2)_n$, $(CH_2)_n$—$C_6Q_4$-$(CH_2)_6$, and for structure 1 additionally selected from $(CH_2)_n$—O and C(O)—O; R is selected from H, $CZ_3$, $(CZ_2)_6CZ_3$, OH, O—(O)CCH$_3$, $(CH_2CH_2O)_6$CH$_3$, $(CH_2)_n$—$C_6Q_5$, cinnamate or p-methoxy-cinnamate, coumarin, phenyl-3-indene, epoxide, C≡C—Si(C$_2$H$_5$)$_3$ or C≡C—Si(i-C$_2$H$_5$)$_3$, each n is independently an integer from 0 to 12, p is an integer from 1-6, $C_6Q_4$ and $C_6Q_5$ denote benzene that is substituted with Q, Q is independently H, F, CH$_3$, CF$_3$ or OCH$_3$, Z is independently H or F, with the proviso that -A-R does not contain an —O—O-(peroxy) linkage, and R" is independently H or CH$_3$.

Further exemplary repeating units of Formula I such as described above are formed by one or more norbornene-type monomers that include, but not limited to, those selected from the group consisting of the following formulae:

| | | |
|---|---|---|
|  | NB | 1 |
| 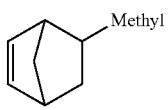 Methyl | MeNB | 2 |
| 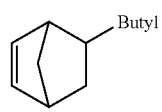 Butyl | BuNB | 3 |
| 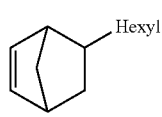 Hexyl | HexNB | 4 |

-continued
| Structure | Name | # |
|---|---|---|
| 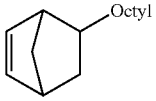 | OctNB | 5 |
| 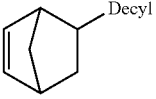 | DecNB | 6 |
| 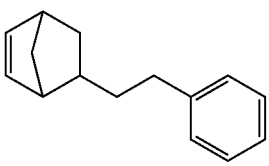 [SMILES: C1=CC2CC1CC2CCc1ccccc1] | PENB | 7 |
|  | TD | 8 |
| 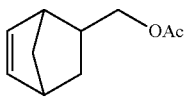 [SMILES: CC(=O)OCC1CC2C=CC1C2] | MeOAcNB | 9 |
| 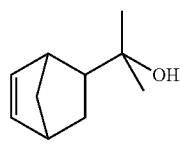 | NBXOH | 10 |
| 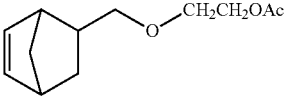 | NBCH₂GlyOAc | 11 |
| 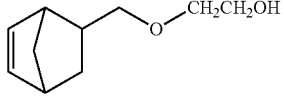 | NBCH₂GlyOH | 12 |
| 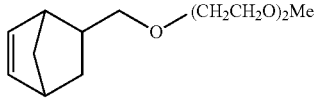 | NBTON | 13 |
| 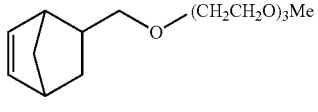 | NBTODD | 14 |
| 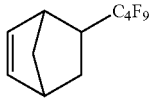 | NBC₄F₉ | 15 |
| 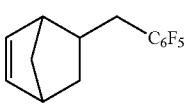 | NBCH₂C₆F₅ | 16 |
| 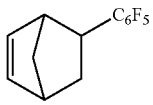 | NBC₆F₅ | 17 |

-continued

| Structure | Name | # |
|---|---|---|
| Norbornene-CH$_2$-C$_6$H$_3$F$_2$ (3,4-difluoro) | NBCH$_2$C$_6$H$_3$F$_2$ | 18 |
| Norbornene-CH$_2$-C$_6$H$_4$-CF$_3$ (4-) | NBCH$_2$C$_6$H$_4$CF$_3$ | 19 |
| Norbornene-(CH$_2$)$_b$-C$_6$F$_5$ | NBalkylC$_6$F$_5$ | 20 |
| Norbornene-C(O)O-CH$_2$C$_2$F$_5$ | FPCNB | 21 |
| Norbornene-C(O)O-CH$_2$CH$_2$C$_4$F$_9$ | FHCNB | 22 |
| Norbornene-C(O)O-CH$_2$(CF$_2$)$_3$CF$_2$H | FOCHNB | 23 |
| Norbornene-C(O)O-CH$_2$CF$_2$CF$_2$H | FPCHNB | 24 |
| Norbornene-CH$_2$-O-C(O)-C$_7$F$_{15}$ | C$_8$PFAcNB | 25 |
| Norbornene-CH$_2$-O-CF$_2$-CFH-OC$_3$F$_7$ | PPVENB | 26 |
| Dicyclopentadiene | DCPD | 27 |
| Norbornene-C$_6$H$_{12}$-epoxide | EONB | 28 |
| Norbornene-CH$_2$-O-CH$_2$-epoxide | MGENB | 29 |

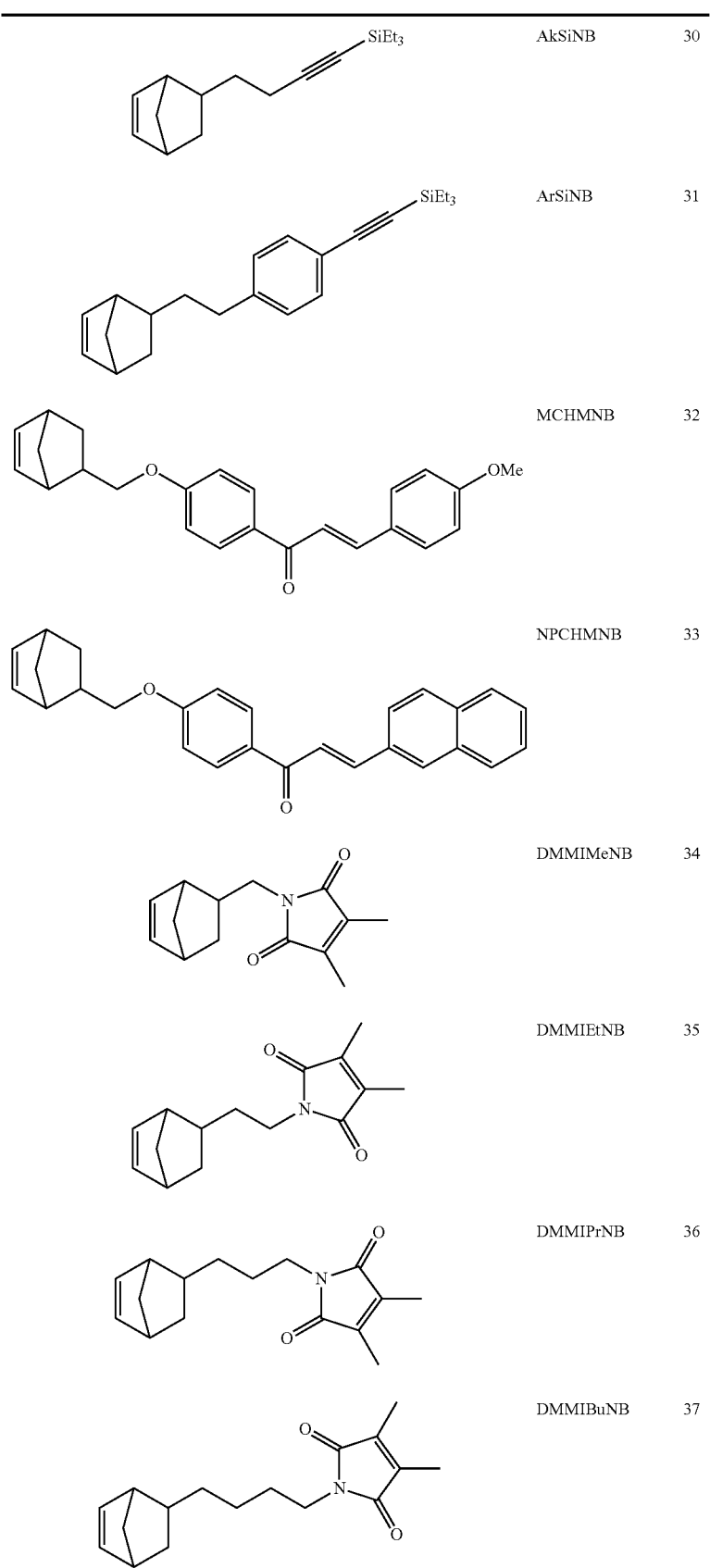

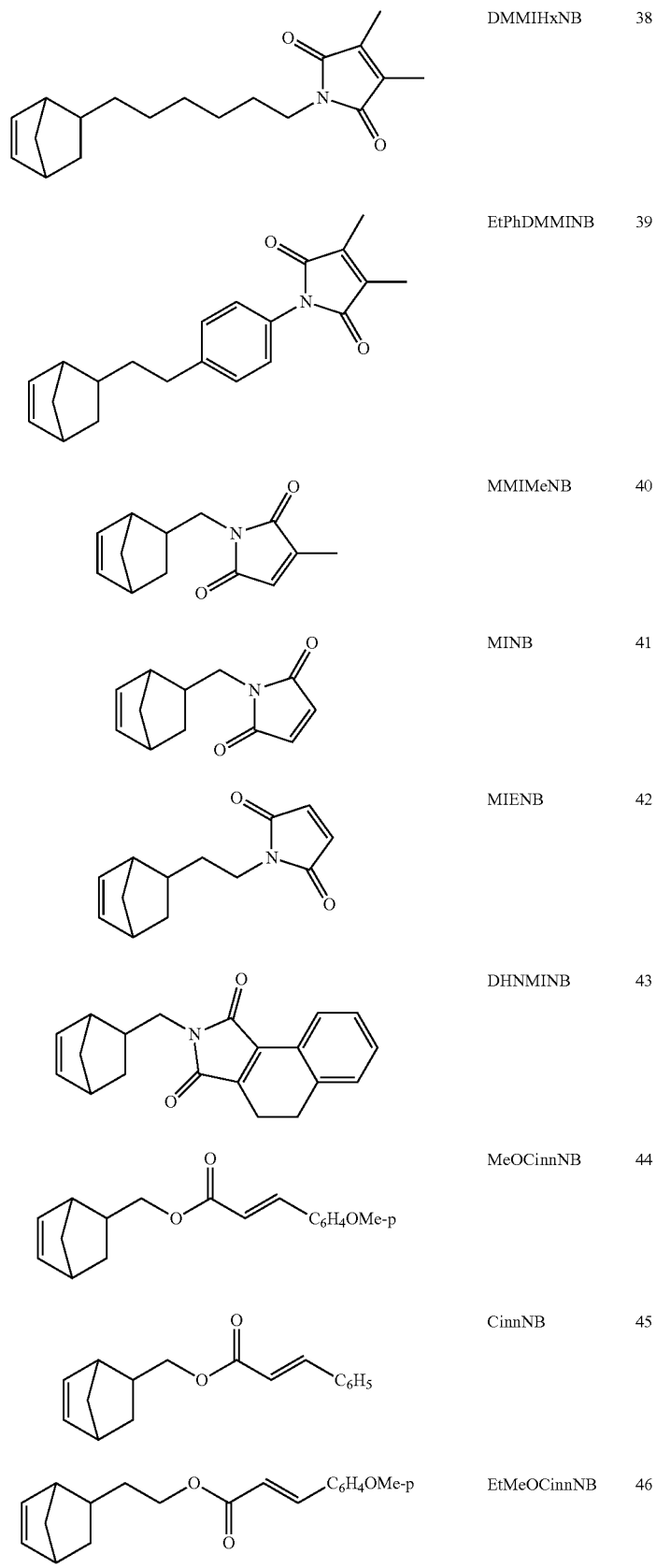

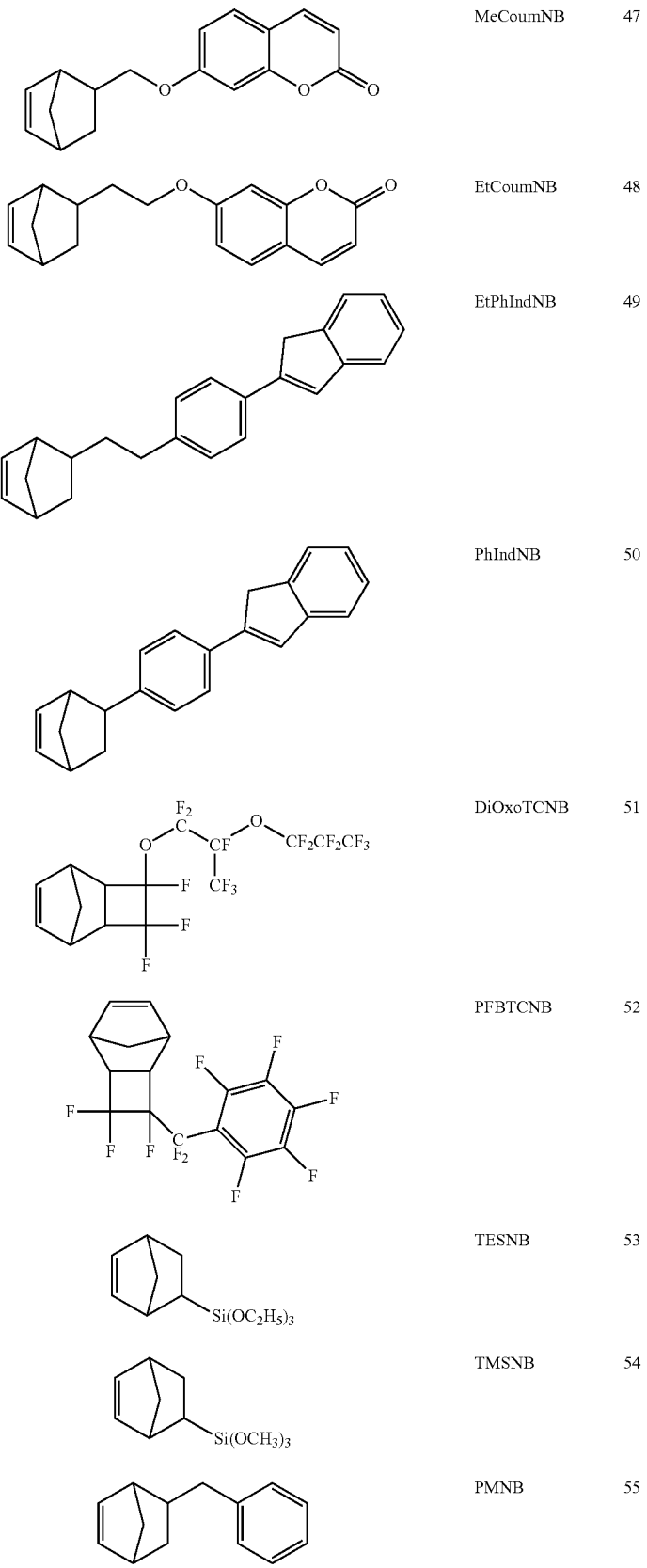
| | | |
|---|---|---|
| | MeCoumNB | 47 |
| | EtCoumNB | 48 |
| | EtPhIndNB | 49 |
| | PhIndNB | 50 |
| | DiOxoTCNB | 51 |
| | PFBTCNB | 52 |
| | TESNB | 53 |
| | TMSNB | 54 |
| | PMNB | 55 | where "Me" means methyl, "Et" means ethyl, "OMe-p" means para-methoxy, "Ph" and "$C_6H_5$" mean phenyl, "$C_6H_4$" means phenylene, "$C_6F_5$" means pentafluorophenyl, in sub-formulae 9 and 11 "OAc" means acetate, in sub-formula 25 "PFAc" means —OC(O)—$C_7F_{15}$, and for each of the above sub-formulae having a methylene bridging group (a $CH_2$ covalently bonded to both the norbornene ring and a functional group), including but not limited to 11-14, 16, 18, 19 and 55, it will be understood that the methylene bridging group can be replaced by a covalent bond or —$(CH_2)_b$— as in formula 20, and b is an integer from 1 to 6.

It will be further noted that while 55 specific examples are provided above, other monomers in accordance with embodiments of the present invention are inclusive of monomers represented by formula Ia where at least one of $R^1$, $R^2$, $R^3$ and $R^4$ are hydrocarbyls, halohydrocarbyls, and perhalocarbyls, inclusive of heteroatoms, that include, —$(CH_2)_n$—Ar— $(CH_2)_n$—C$(CF_3)_2$—OH, —$(CH_2)_n$—Ar—$(CH_2)_n$—$OCH_2C(CF_3)_2$—OH, —$(CH_2)_n$—C$(CF_3)_2$—OH, —$(CH_2)_n$—C$(CF_3)(CH_3)$—OH, —$((CH_2)_i$—O—$)_k$—$(CH_2)$—C$(CF_3)_2$—OH, $(CH_2)_n$—C(O)NHR*, $(CH_2)_n$—C(O)Cl, —$(CH_2)_n$—C(O)OR*, $(CH_2)_n$—OR*, —$(CH_2)_n$—OC(O)R* and —$(CH_2)_n$ —C(O)R*, where n independently represents an integer from 0 to 12, i is 2, 3 or 4, k is 1, 2 or 3, Ar is aryl, for example phenyl, and R* independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl. Exemplary perhalogenated alkyl groups include, but are not limited to, trifluoromethyl, trichloromethyl, —$C_2F_5$, —$C_3F_7$, —$C_4F_9$, —$C_7F_{15}$, and —$C_{11}F_{23}$. Exemplary halogenated or perhalogenated aryl and aralkyl groups include, but are not limited groups having the formula —$(CH_2)_x$-$C_6F_yH_{5-y}$, and —$(CH_2)_x$—$C_6F_yH_{4-y}$-p$C_zF_qH_{2z+1-q}$, where x, y, q, and z are independently selected integers from 0 to 5, 0 to 5, 0 to 9, and 1 to 4, respectively. Specifically, such exemplary halogenated or perhalogenated aryl groups include, but are not limited to, pentachlorophenyl, pentafluorophenyl, pentafluorobenzyl, 4-trifluoromethylbenzyl, pentafluorophenylethyl, pentafluorophenpropyl, and pentafluorophenbutyl.

While Formula I and Ia, as well as each of the sub-formulae and generic formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that some embodiments of the present invention are made to take advantage of such differences by using monomers that are either a mixture of isomers that is rich in either the exo- or endo-isomer, or are essentially the pure advantageous isomer.

Other embodiments of the present invention encompass polymers of Formula I that comprise repeating units where one of $R^{1-4}$, for example $R^1$, is a fluorinated or perfluorinated alkyl, aryl or aralkyl group as described above and the others of $R^{1-4}$ are H. In some embodiments $R^1$ is selected from one of the above sub-formulae 15-26 ($NBC_4F_9$, $NBCH_2C_6F_5$, $NBC_6F_5$, $NBCH_2C_6H_3F_2$, $NBCH_2C_6H_4CF_3$, $NBalkylC_6F_5$, FPCNB, FHCNB, FOCHNB, FPCHNB, $C_8$PFAcNB, or PPVENB, respectively), and in some other embodiments from sub-formulae 16, 17, 18, 19, 20 or 26 ($NBCH_2C_6F_5$, $NBC_6F_5$, $NBCH_2C_6H_3F_2$, $NBCH_2C_6H_4CF_3$, $NBalkylC_6F_5$, or PPVENB, respectively).

Further still, other embodiments of the present invention encompass polymers of Formula I that have repeating units where one of $R^{1-4}$, for example $R^1$, is a photoreactive or crosslinkable group as described above and the others of $R^{1-4}$ are H. In some embodiments $R^1$ is a group as shown in one of the above sub-formulae 27-50 and in some other embodiments as shown in sub-formulae 34, 35, 36, 37 and 38 (DMMIMeNB, DMMIEtNB, DMMIPrNB, DMMIBuNB and DMMIHxNB, respectively).

Further still, other embodiments of the present invention encompass polymers of Formula I that have repeating units where one of $R^{1-4}$, for example $R^1$, is a polar group having a hydroxy, carboxy, acetoxy or oligoethyleneoxy moiety as described above and the others of $R^{1-4}$ denote H. In some embodiments $R^1$ is a group as shown in one of the above sub-formulae 9-14, and in some other embodiments a group as shown in sub-formula 9 (MeOAcNB).

Further still, other embodiments of the present invention encompass polymers having a first type of repeating unit selected from fluorinated repeating units as described above and a second type of repeating unit selected from crosslinkable repeating units, also as described above. Polymers of this embodiment include polymers having a first type of repeating unit selected from sub-formulae 15-26, and in some other embodiments 15, 16, 17, 18, 19, 20 and 26 ($NBC_4F_9$, $NBCH_2C_6F_5$, $NBC_6F_5$, $NBCH_2C_6H_3F_2$, $NBCH_2C_6H_4CF_3$, $NBalkylC_6F_5$, and PPVENB) and a second type of repeating unit selected from sub-formulae 34, 35, 36, 37 and 38 (DMMIMeNB, DMMIEtNB, DMMIPrNB, DMMIBuNB and DMMIHxNB, respectively).

Further still, other embodiments of the present invention encompass polymers having a first type of repeating unit selected from fluorinated repeating units as described above, a second type of repeating unit selected from crosslinkable repeating units, also as described above and a third type of repeating unit selected from polar repeating units, again as described above. Polymers of this embodiment include polymers having a first repeating unit of sub-formula 9 (MeOAcNB), a second type of repeating unit selected from sub-formulae 34, 35, 36, 37, or 38 (DMMIMeNB, DMMIEtNB, DMMIPrNB, DMMIBuNB and DMMIHxNB, respectively), and a third type of repeating unit selected from sub-formula 16 ($NBCH_2C_6F_5$).

Further still, other embodiments of the present invention encompass polymers having more than three different types of repeating units in accordance with Formula I. Other embodiments of the present invention encompass a polymer blend of a first polymer having a first type of repeating unit in accordance with Formula I, and a second polymer having, at least, a first type of repeating unit and a second type of repeating unit in accordance with Formula I that is distinct from the first type. Alternatively such polymer blends can encompass the aforementioned second polymer mixed with an alternative first polymer having two or more distinct types of repeat units in accordance with Formula I. Further, such polymer blends can encompass the aforementioned alternative first polymer mixed with an alternative second polymer having three distinct types of repeat units in accordance with Formula I.

Further still, other embodiments of the present invention encompass polymers having a first and a second distinct type of repeat units in accordance with Formula I where the ratio of such first and second type of repeat units is from 95:5 to 5:95. In other embodiments the ratio of such first and second type of repeat units is from 80:20 to 20:80. In still other embodiments the ratio of such first and second type of repeat units is from 60:40 to 40:60. In yet other embodiments the ratio of such first and second type of repeat units is from 55:45 to 45:55.

Examples of suitable norbornene monomers, polymers and methods for their synthesis are provided herein and can also be found in U.S. Pat. No. 5,468,819, U.S. Pat. No. 6,538,087, US 2006/0020068 A1, US 2007/0066775 A1, US 2008/0194740 A1, PCT/EP2011/004281, U.S. Ser. No. 13/223,784, PCT/EP2011/004282 and U.S. Ser. No. 13/223,884, relevant portions of which are incorporated into this application by reference. For example, exemplary polymerizations processes employing Group VIII transition metal catalysts are described in the aforementioned US 2006/0020068 A1.

The polymer embodiments of the present invention are formed having a weight average molecular weight ($M_w$) that is appropriate to their use. Generally, a $M_w$ from 5,000 to 500,000 is found appropriate for some embodiments, while for other embodiments other $M_w$ ranges can be advantageous. For example, in some embodiments, the polymer has a $M_w$ of at least 30,000, while in other embodiments the polymer has a $M_w$ of at least 60,000. In other embodiments, the upper limit of the polymer's $M_w$ is up to 400,000, while in other embodiments the upper limit of the polymer's $M_w$ is up to 250,000. It will be understood that since an appropriate $M_w$ is a function of the desired physical properties in the cured polymer, films, layers or structures derived therefrom, it is a design choice and thus any $M_w$ within the ranges provided above is within the scope of the present invention.

In some embodiments of the present invention, crosslinkable or crosslinked polycycloolefinic polymers are used as bank structure material or as a component thereof. It has been found that such crosslinkable or crosslinked polymers can serve to improve one or more properties selected from structural integrity, durability, mechanical resistivity and solvent resistivity of the gate dielectric layer and the electronic device. Suitable crosslinkable polymers are for example those having one or more repeating units of Formula I, wherein one or more of $R^{1-4}$ denotes a crosslinkable group, for example units formed by monomers selected from sub-formulae 27-50.

For crosslinking, the polymer, generally after deposition thereof, is exposed to electron beam or electromagnetic (actinic) radiation such as X-ray, UV or visible radiation, or heated if it contains thermally crosslinkable groups. For example, actinic radiation may be employed to image the polymer using a wavelength of from 11 nm to 700 nm, such as from 200 to 700 nm. A dose of actinic radiation for exposure is generally from 25 to 15000 mJ/cm². Suitable radiation sources include mercury, mercury/xenon, mercury/halogen and xenon lamps, argon or xenon laser sources, x-ray. Such exposure to actinic radiation is to cause crosslinking in exposed regions. Although other repeating unit pendent groups that crosslink can be provided, generally such crosslinking is provided by repeating units that encompass a maleimide pendent group, that is to say one of $R^1$ to $R^4$ is a substituted or unsubstituted maleimide moiety. If it is desired to use a light source having a wavelength outside of the photo-absorption band of the maleimide group, a radiation sensitive photosensitizer can be added. If the polymer contains thermally crosslinkable groups, optionally an initiator may be added to initiate the crosslinking reaction, for example in case the crosslinking reaction is not initiated thermally.

In some embodiments in accordance with the present invention, the bank structures are post exposure baked at a temperature from 70° C. to 130° C., for example for a period of from 1 to 10 minutes. Post exposure bake can be used to further promote crosslinking of crosslinkable moieties within exposed portions of the polymer.

In other embodiments in accordance with the present invention, the crosslinkable polymer composition comprises a stabilizer material or moiety to prevent spontaneous crosslinking and improve shelf life of the polymer composition. Suitable stabilizers are antioxidants such as catechol or phenol derivatives that optionally contain one or more bulky alkyl groups, for example t-butyl groups, in ortho-position to the phenolic OH group.

In order to improve the processing of the individual device components, including functional layers and bank structures, and the integrity of the electronic device, it is desirable to decrease the time needed for the process while keeping or improving the physical properties of the components being formed. This can be maintained where subsequent components and solvents used in forming such components are orthogonal and thus do not dissolve each other. Where such orthogonality is difficult to obtain, crosslinking, typically UV crosslinking, a first component to make such first component insoluble with respect to the polymer composition of a second component will prevent any influence of the properties of either component on the other component.

Shortening the time needed for the processing can be done for example by tuning the coating process, while decreasing the time needed for UV crosslinking can be achieved both by chemical adjustment of the polymer or by changes in the process.

However, chemical modifications of polymers are limited, because the UV sensitivity is related to certain properties of the polymer, and for example changes towards increased UV sensitivity may decrease the solubility. Changing the process, for example, by using higher power UV, could increase the possibility of creating an ozone atmosphere and thus cause undesired changes in the surface of the polymer dielectric.

Therefore, some embodiments in accordance with the present invention encompass polymer compositions comprising one or more crosslinker additives. Such additives comprise two or more functional groups that are capable of reacting with the pendent crosslinkable groups of the polycycloolefinic polymer used to form the bank structure. It will also be understood that the use of such crosslinker additives can also enhance the crosslinking of the aforementioned polymer.

In some embodiments in accordance with the present invention, crosslinking can be achieved by exposure to UV radiation.

The use of a crosslinker enhances the ability to pattern the bank structures through the use of an imagewise exposure to an appropriate wavelength and dose of UV radiation.

In some embodiments in accordance with the present invention the crosslinkable group of the crosslinker is selected from a maleimide, a 3-monoalkyl-maleimide, a 3,4-dialkylmaleimide, an epoxy, a vinyl, an acetylene, an indenyl, a cinnamate or a coumarin group, or a group that comprises a substituted or unsubstituted maleimide portion, an epoxide portion, a vinyl portion, an acetylene portion, an indenyl portion, a cinnamate portion or a coumarin portion.

In some embodiments in accordance with the present invention, the crosslinker is selected of formula III1 or III2

$$P\text{-}A''\text{-}X'\text{-}A''\text{-}P \quad \quad \quad \text{III1}$$

$$H_{4-c}C(A''\text{-}P)_c \quad \quad \quad \text{III2}$$

wherein X' is O, S, NH or a single bond, A'' is a single bond or a connecting, spacer or bridging group, which is selected from $(CZ_2)_n$, $(CH_2)_n$—$(CH=CH)_p$—$(CH_2)_n$, $(CH_2)_n$—O—$(CH_2)_n$, $(CH_2)_n$—$C_6Q_{10}$-$(CH_2)_n$, and $C(O)$, where each n is independently an integer from 0 to 12, p is an integer from 1-6, Z is independently H or F, $C_6Q_{10}$ is cyclohexyl that is substituted with Q, Q is independently H, F, $CH_3$, $CF_3$, or $OCH_3$, P is a crosslinkable group, and c is 2, 3, or 4, and wherein formula III1 at least one of X' and the two groups A" is not a single bond.

In some embodiments P is selected from a maleimide, a 3-monoalkyl-maleimide, a 3,4-dialkylmaleimide, an epoxy, a vinyl, an acetylene, an indenyl, a cinnamate or a coumarin group, or comprises a substituted or unsubstituted maleimide portion, an epoxide portion, a vinyl portion, an acetylene portion, an indenyl portion, a cinnamate portion or a coumarin portion.

Suitable compounds of formula III1 are selected from formula C1:

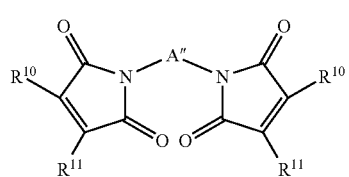

C1 wherein $R^{10}$ and $R^{11}$ are independently of each other H or a $C_1$-$C_6$ alkyl group, and A" is as defined in formula III1. In one embodiment of this invention, the crosslinkers are selected from DMMI-butyl-DMMI, DMMI-pentyl-DMMI and DMMI-hexyl-DMMI, wherein "DMMI" means 3,4-dimethylmaleimide.

In some embodiments the spacer group A" denotes linear $C_1$ to $C_{30}$ alkylene or branched $C_3$ to $C_{30}$ alkylene or cyclic $C_5$ to $C_{30}$ alkylene, each of which is unsubstituted or mono- or polysubstituted by F, Cl, Br, I or CN, wherein optionally one or more non-adjacent $CH_2$ groups are replaced, in each case independently from one another, by —O—, —S—, —NH—, —NR$^{18}$—, —SiR$^{18}$R$^{19}$—, —C(O)—, —C(O)O—, —OC(O)—, —OC(O)—O—, —S—C(O)—, —C(O)—S—, —CH=CH— or —C≡C— in such a manner that O and/or S atoms are not linked directly to one another, $R^{18}$ and $R^{19}$ are independently of each other H, methyl, ethyl or a $C_3$ to $C_{12}$ linear or branched alkyl group.

Suitable groups A" are —(CH$_2$)$_r$—, —(CH$_2$CH$_2$O)$_s$—, —CH$_2$CH$_2$—, —CH$_2$CH$_2$—S—CH$_2$CH$_2$— or —CH$_2$CH$_2$—NH—CH$_2$CH$_2$— or —(SiR$^{18}$R$^{19}$—O)$_r$—, with r being an integer from 2 to 12, s being 1, 2 or 3 and $R^{18}$ and $R^{19}$ having the meanings given above.

Further groups A" are selected from methylene, ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene.

The synthesis of crosslinkers like those of formula C1 is disclosed for example in U.S. Pat. No. 3,622,321.

In some embodiments in accordance with the present invention the polymer composition comprises a crosslinkable polycycloolefinic polymer and a reactive adhesion promoter. The reactive adhesion promoter comprises a first functional group which is a surface-active group that is capable of interactions, for example chemical bonding, with the substrate on which the bank structures are provided, and a second functional group that is capable of interactions, either with or without forming a chemical bond, with the polycycloolefinic polymer, for example by crosslinking with a pendent crosslinkable group in the polycycloolefinic polymer. The adhesion promoter may be used especially if a photolithography process is employed when providing the bank structures or further functional layers.

In some embodiments in accordance with the present invention, the adhesion promoter is a compound of formula IV $$G^1\text{-}A''\text{-}G^2 \qquad\qquad \text{IV}$$

wherein $G^1$ is a surface-active group, for example a silane or silazane group, A" is a single bond or a connecting, spacer or bridging group, for example as defined in formula III1 above, and $G^2$ is a crosslinkable group, for example as defined in formula III1 above, or $G^2$ is a non-reactive compatibilizing group for the polycycloolefinic polymer. As used herein, the term "compatibilizing" will be understood to mean an interfacial agent or group that facilitates the formation of uniform blends of normally immiscible polymers. For example, if the polycycloolefinic polymer comprises a halogenated or perhalogenated portion, like for example in monomers 15 to 26, the compatibilizing group $G^2$ may be selected from a halogenated or perhalogenated alkyl, aryl or aralkyl group.

In some embodiments $G^1$ is a group of the formula —SiR$^{12}$R$^{13}$R$^{14}$, or a group of the formula —NH—SiR$^{12}$R$^{13}$R$^{14}$, wherein $R^{12}$, $R^{13}$ and $R^{14}$ are each independently selected from halogen, silazane, $C_1$-$C_{12}$-alkoxy, $C_1$-$C_{12}$-alkylamino, optionally substituted $C_5$-$C_{20}$-aryloxy and optionally substituted $C_2$-$C_{20}$-heteroaryloxy, and wherein one or two of $R^{12}$, $R^{13}$ and $R^{14}$ may also denote $C_1$-$C_{12}$-alkyl, optionally substituted $C_5$-$C_{29}$-aryl or optionally substituted $C_2$-$C_{29}$-heteroaryl.

In other embodiments $G^2$ is a crosslinkable group selected from a maleimide, a 3-monoalkyl-maleimide, a 3,4-dialkylmaleimide, an epoxy, a vinyl, an acetyl, an indenyl, a cinnamate or a coumarin group, or comprises a substituted or unsubstituted maleimide portion, an epoxide portion, a vinyl portion, an acetyl portion, an indenyl portion, a cinnamate portion or a coumarin portion.

In other embodiments, $G^2$ is a non-reactive, compatibilizing group selected from a $C_1$-$C_{11}$ halogenated or perhalogenated alkyl, a $C_6$-$C_{14}$ halogenated or perhalogenated aryl, or a halogenated or perhalogenated $C_7$-$C_{14}$ aralkyl, more specifically from a $C_1$-$C_{11}$ alkyl, a $C_6$-$C_{14}$ aryl or a $C_7$-$C_{14}$ aralkyl, each of which is fluorinated or perfluorinated. In other embodiments $G^2$ is selected from —C$_4$F$_9$, —(CH$_2$)$_b$—C$_6$F$_5$, —CH$_2$C$_6$F$_2$, —CH$_2$—C$_2$F$_5$, —CH$_2$CH$_2$—C$_4$F$_9$, —CH$_2$—(CF$_2$)$_3$—CF$_2$H, —CH$_2$CF$_2$CF$_2$H, —C$_7$F$_{15}$ or CF$_2$CFHOC$_3$F$_7$, wherein b is an integer from 1 to 6.

In other embodiments A" is selected from (CZ$_2$)$_n$, (CH$_2$)$_n$—(CH=CH)$_p$—(CH$_2$)$_n$, (CH$_2$)$_n$—O, (CH$_2$)$_n$—O—(CH$_2$)$_n$, (CH$_2$)$_n$—C$_6$Q$_4$-(CH$_2$)$_6$, (CH$_2$)$_n$—C$_6$Q$_{10}$-(CH$_2$)$_n$ and C(O)—O, where each n is independently an integer from 0 to 12, p is an integer from 1-6, Z is independently H or F, $C_6Q_4$ is phenyl that is substituted with Q, $C_6Q_{10}$ is cyclohexyl that is substituted with Q, Q is independently H, F, $CH_3$, $CF_3$ or $OCH_3$.

Suitable compounds of formula IV are selected from formula A1:

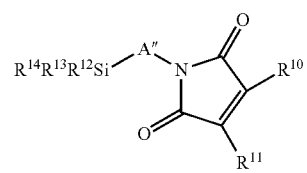

A1 where $R^{12}$, $R^{13}R^{14}$, and A" are as defined above, and $R^{10}$ and $R^{11}$ are each independently H or a $C_1$-$C_6$ alkyl group. Suitable compounds of formula A1 are for example DMMI-propyl-Si(OEt)$_3$, DMMI-butyl-Si(OEt)$_3$, DMMI-butyl-Si(OMe)$_3$, DMMI-hexyl-Si(OMe)$_3$, wherein "DMMI" means 3,4-dimethylmaleimide.

The aforementioned polymers and polymer compositions are used for forming bank structures in an organic electronic device. The bank structures of the present invention can be used in a large variety of organic electronic (OE) devices, especially in OFETs and OLEDs, where they are typically located around the electrodes (in OFETs) or on the electrode (in OLEDs).

The bank structures comprising polycycloolefinic polymers in accordance with the present invention allow for time-, cost- and material-effective production of OE devices, especially OFETs and OLEDs, employing organic semiconductor (OSC) materials and organic dielectric materials on a large scale.

Advantageously the bank structures in accordance with the present invention can be applied as single layer structures. Thus, in some embodiments in accordance with the present invention the bank structures are formed as single layers comprising a polycycloolefinic polymer or a polycycloolefinic polymer blend as described above and below.

Further advantageously, the polycycloolefinic polymers used in the bank structures in accordance with the present invention can be tailored to overcome the drawbacks that have been observed in previously known bank structure materials, such as limited processability and limited solubility in organic solvents. Thus, the polycycloolefinic polymers show a good tunability of the polymers' properties like their solubility in organic solvents, and allow a flexible material design that combines both hydrophobicity and UV sensitivity. In particular they are processable from unfluorinated, environmentally benign solvents, can be cross-linked by UV curing processes, and can be deposited by standard methods like ink-jet printing or flexo printing.

Thus, in other embodiments in accordance with the present invention the bank structures comprise a polycycloolefinic polymer that comprises a hydrophobic part represented by a fluorinated group and a UV sensitive part represented by a pendent UV cross-linkable group.

The bank structures in accordance with the present invention can be provided by additive processing, for example by printing the bank structures from a polymer solution using printing technologies like ink-jet printing, flexographic printing or gravure printing, followed by solvent removal and optionally curing the polymer for example by UV exposure.

Alternatively the bank structures in accordance with the present invention can be provided by subtractive processing, for example by photolithography-type processing. For example, after spin-coating and drying the coated material is exposed to UV radiation like a negative type resist, and is then developed with a solvent to obtain a patterned structure, which can then be further cured by UV exposure to increase the crosslinking.

In some embodiments in accordance with the present invention, the bank structures comprising the polycycloolefinic polymer are provided in the organic electronic device such that they are overlying one or more electrodes, for example the source and drain electrodes in an OFET, and define a well or a pattern of wells in which a functional layer, like for example the organic semiconducting layer, is deposited, so that the bank structures are contacting said electrodes and said functional layer.

For example in an OFET comprising source and drain electrodes which are spaced apart with a channel region located therebetween, the bank structures are deposited overlying the source and drain electrodes, and are patterned such that they define a well that extends over the channel region. An organic semiconducting layer is provided in the channel region, so that the bank structures contact the source and drain electrodes and the organic semiconducting layer.

Some embodiments in accordance with the present invention relate to a process of providing bank structures comprising the following steps: A solution of the bank structure material is spin-coated or otherwise deposited onto a substrate, forming a thin film. The thin film is then exposed to UV radiation through a photomask using a mask aligner. The thin film is then developed to leave a pattern of the exposed bank structure material, washed with organic solvent to remove uncured material, and dried. The bank structure material is then flood-illuminated by UV radiation.

Other embodiments in accordance with the present invention encompass an organic electronic device comprising, or being obtained through the use of, a polycycloolefinic polymer or a polymer composition as described above and below. Such organic electronic devices include, among others, organic field effect transistors (OFETs), organic thin film transistors (OTFTs), which can be top gate or bottom gate transistors, Organic Light Emitting Diodes (OLED) or Organic Photovoltaic (OPV) Devices. For example, bottom gate and top gate transistors made through the use of a polymer or polymer composition in accordance with the present invention are depicted schematically in FIGS. 1 and 2.

Turning now to FIG. 1, a schematic and simplified representation of a bottom gate OFET device in accordance with an embodiment of the present invention is provided. Such OFET device includes a substrate (1), a gate electrode (2), a dielectric layer (3) serving as gate insulator, source and drain electrodes (4) that are spaced apart with a channel region (7) located therebetween, first and second bank structures (5a, 5b) that are patterned such that they define a well (8) that extends over the channel region (7), and an OSC layer (6) provided in the channel region (7), wherein the bank structures (5a, 5b) are derived from a polycycloolefinic polymer or a polymer composition as described above and below.

Another embodiment in accordance with the present invention relates to a process for preparing a bottom gate OFET device, for example as illustrated in FIG. 1, by a) forming gate electrode (2) on a substrate (1) as depicted, b) depositing a layer of dielectric material (3) on the gate electrode (2), c) forming source and drain electrodes (4) on the dielectric layer (3) such that they are spaced apart with a channel region (7) located therebetween, d) forming bank structures (5a, 5b) by depositing a bank structure material comprising a polycycloolefinic polymer or comprising a polymer composition comprising a polycycloolefinic polymer, on the source and drain electrodes (4), thereby defining a well (8) that extends over the channel region (7), e) depositing a layer of semiconductor material (6) in the well (8) formed by the bank structures (5a, 5b) and onto the source and drain electrodes (4).

Figure 2:
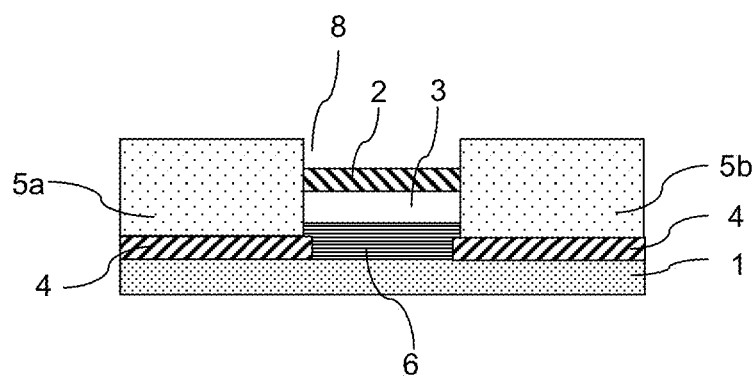
FIG. 2 is a schematic representation of a top gate OFET device in accordance with the present invention.

Turning now to FIG. 2, a schematic and simplified representation of a top gate OFET device in accordance with another embodiment of the present invention is provided. Such OFET device includes a substrate (1), source and drain electrodes (4) that are spaced apart with a channel region (not shown) located therebetween, first and second bank structures (5a, 5b) that are patterned such that they define a well (8) that extends over the channel region, an OSC layer (6) provided in the channel region (7), a dielectric layer (3) serving as gate insulator, and gate electrode (2), wherein the bank structures (5a, 5b) are derived from a polycycloolefinic polymer or a polymer composition as described above and below.

Another embodiment in accordance with the present invention relates to a process for preparing a top gate OFET device, for example as illustrated in FIG. 2, by a) forming source and drain electrodes (4) on a substrate (1) such that they are spaced apart with a channel region located therebetween, b) forming bank structures (5a, 5b) by depositing a bank structure material comprising a polycycloolefinic polymer, or comprising a polymer composition comprising a polycycloolefinic polymer, on the source and drain electrodes (4), thereby defining a well (8) that extends over the channel region, c) depositing a layer of semiconductor material (6) in the well (8) formed by the bank structures (5a, 5b) and onto the source and drain electrodes (4), d) depositing a layer of dielectric material (3) on the semiconductor layer (6), e) forming gate electrode (2) on the dielectric layer (3).

The electrodes (2, 4) are for example applied onto the substrate or the dielectric layer (3) by a sputtering process, and can be patterned by etching and/or lithographic patterning. The bank structures (5a, 5b) can be applied in the desired shape by solution processing, e.g., in a printing process, drying and optional curing, or they can be applied and patterned into the desired shape by a lithographic process. The OSC layer (6) and dielectric layer (3) can be applied by a coating or printing process.

The solvent used for depositing the polycycloolefinic polymer is removed before depositing the organic semiconductor on or between the bank structures or, if a patterning step is included, before said patterning of the bank structures.

In some embodiments in accordance with the present invention, deposition and/or forming of the layers and structures of the OFET are performed using solution processing techniques where such techniques are possible. For example a formulation or composition of a material, typically a solution encompassing one or more organic solvents, can be deposited or formed using preferred techniques that include, but are not limited to, dip coating, slot-die coating, spin-coating, ink jet printing, letter-press printing, screen printing, doctor blade coating, roller printing, reverse-roller printing, offset lithography printing, flexographic printing, web printing, spray coating, brush coating, or pad printing, followed by the evaporation of the solvent employed to form such a solution. For example, an organic semiconductor material, a bank structure material and an organic dielectric material can each be deposited or formed by spin coating, flexographic printing, and inkjet printing techniques in an order appropriate to the device being formed.

In some embodiments in accordance with the present invention the polymer composition comprises, in addition to one or more polycycloolefinic polymers, a casting or printing solvent, and optionally one or more additives selected from crosslinking agents, adhesion promoters, reactive solvents, stabilizers, UV sensitizers, and thermal sensitizers.

In some embodiments in accordance with the present invention the solvents are selected from, but not limited to, organic ketones such as methyl ethyl ketone (MEK), methyl n-amyl ketone (2-heptanone, MAK), decanone, 3-decanone, cyclohexanone and, ethers such as butyl-phenyl ether, 4-methylanisole and aromatic hydrocarbons such as cyclohexylbenzene, or mixtures thereof. In some embodiments, the concentration of the bank structure material in the solvent is from 1 to 30 wt. %, although other concentrations can also be appropriate. Organic ketone solvents with a high boiling point have been found to be especially suitable solvents where inkjet and flexographic printing techniques are employed.

Some OFET embodiments in accordance with the present invention employ a gate dielectric layer (3) that consists of a dielectric material ("gate dielectric") having a permittivity (e of 3.0 or less ("low k dielectric"), as disclosed in WO 03/052841. In some embodiments e is in the range of from 1.3 to 3.0, in some other embodiments from 1.7 to 3.0 has been found to be appropriate while in other embodiments a range from 2.0 to 3.0 is appropriate. In still other OFET embodiments in accordance with the present invention a permittivity range of from 2.5 to 3.0 or from 2.0 to 2.6 has been found to be appropriate.

In some OFET embodiments in accordance with the present invention that employ a low k gate dielectric material, as described above, for the gate dielectric layer such material is typically an organic fluoropolymer. Suitable fluoropolymers include, for example, highly soluble perfluoropolymers like those from the commercially available CYTOP™ series (Asahi Glass), Teflon AF® series (DuPont) or Hyflon AD® series (from Solvay). CYTOP polymers are described in "Modern Fluoroplastics", edited by John Scheris, John Wiley & Sons Ltd., 1997, Chapter: "Perfluoropolymers Obtained by Cyclopolymerisation" by N. Sugiyama, pages 541ff. Teflon AF is described in "Modern Fluoroplastics", edited by John Scheris, John Wiley & Sons Ltd., 1997, Chapter: "Teflon AF amorphous fluoropolymers" by P. R. Resnick, pages 397ff. Hyflon AD is described in "High Performance Perfluoropolymer Films and Membranes" V. Arcella et. al., Ann. N.Y. Acad. Sci. 984, pages 226-244 (2003).

The other components or functional layers of the electronic device, like the substrate, the gate and source and drain electrodes, can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

Generally the thickness of a functional layer, for example a gate dielectric or semiconductor layer, in some preferred electronic device embodiments according to the present invention is from 0.001 µm (in case of a monolayer) to 10 µm. In other embodiments such thickness ranges from 0.001 to 1 µm, and in still other embodiments from 5 nm to 500 nm, although other thicknesses or ranges of thickness are contemplated and thus are within the scope of the present invention.

Various substrates may be used for the fabrication of the electronic device embodiments of the present invention. For example glass or plastic materials are most often used. Suitable polymeric materials include, but are not limited to, alkyd resins, allyl esters, benzocyclobutenes, butadiene-styrene, cellulose, cellulose acetate, epoxy polymers, ethylene-chlorotrifluoro ethylene copolymers, ethylene-tetra-fluoroethylene copolymers, fiber glass enhanced plastic, fluorocarbon polymers, hexafluoropropylenevinylidene-fluoride copolymer, polyethylene, parylene, polyamide, polyimide, polyaramid, polydimethylsiloxane, polyethersulphone, polyethylenenaphtalate, polyethyleneterephthalate, polyketone, polymethylmethacrylate, polypropylene, polystyrene, polysulphone, polytetrafluoroethylene, polyurethanes, polyvinylchloride, polycycloolefin, silicone rubbers, and silicones, where polyethyleneterephthalate, polyimide, polycycloolefin and polyethylenenaphtalate materials have been found most appropriate. Additionally, for some embodiments of the present invention the substrate can be any suitable material, for example plastic, metal or glass material, coated with one or more of the above listed materials. It will be understood that in forming such a substrate, methods such as extruding, stretching, rubbing or photochemical techniques can be employed to provide a homogeneous surface for device fabrication as well as to provide pre-alignment of an organic semiconductor material in order to enhance carrier mobility therein.

The gate, source and drain electrodes of the OFET device embodiments in accordance with the present invention can be deposited or formed by liquid coating, such as spray-, dip-, web- or spin-coating, or by vacuum deposition methods including but not limited to physical vapor deposition (PVD), chemical vapor deposition (CVD) or thermal evaporation methods. Suitable electrode materials and deposition methods are known to the person skilled in the art. Suitable electrode materials include, without limitation, inorganic or organic materials, or composites of the two. Exemplary electrode materials include polyaniline, polypyrrole, poly(3,4-ethylenedioxythiophene) (PEDOT) or doped conjugated polymers, further dispersions or pastes of graphite or particles of metal such as Au, Ag, Cu, Al, Ni or their mixtures as well as sputter coated or evaporated metals such as Cu, Cr, Pt/Pd, Ag, Au or metal oxides such as indium tin oxide (ITO) F-doped ITO or Al-doped ZnO. Organometallic precursors may also be used and deposited from a liquid phase.

The organic semiconductor (OSC) layer can be an n- or p-type OSC, which can be deposited by PVD, CVD or solution deposition methods. Effective OSCs exhibit a FET mobility of greater than $1\times10^{-5}$ cm$^2$V$^{-1}$s$^{-1}$.

OSC embodiments in accordance with the present invention can be either OFETs where the OSC is used as the active channel material, OPV devices where the OSC is used as charge carrier material, or organic rectifying diodes (ORDs) where the OSC is a layer element of such a diode. OSCs for such embodiments can be deposited by any of the previously discussed deposition methods, but as they are generally deposited or formed as blanket layers, solvent coated methods such as spray-, dip-, web- or spin-coating, or printing methods such as ink-jet printing, flexo printing or gravure printing, are typically employed to allow for ambient temperature processing. However, OSCs can be deposited by any liquid coating technique, for example ink-jet deposition or via PVD or CVD techniques.

For some OFET embodiments, the semiconducting layer that is formed can be a composite of two or more of the same or different types of semiconductors. For example, a p-type OSC material may, for example, be mixed with an n-type material to achieve a doping effect of the layer. In some preferred embodiments of the invention, multilayer semiconductor layers are used. For example an intrinsic semiconductor layer can be deposited near the gate dielectric interface and a highly doped region can additionally be coated adjacent such an intrinsic layer.

The OSC material employed for electronic device embodiments in accordance with the present invention can be any conjugated molecule, for example an aromatic molecule containing two or more aromatic rings, and in some embodiments at least three aromatic rings. In some embodiments of the present invention, the OSC contains aromatic rings selected from 5-, 6- or 7-membered aromatic rings, while in other embodiments the OSC contains aromatic rings selected from 5- or 6-membered aromatic rings. The OSC material may be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings may be optionally substituted with alkyl, alkoxy, polyalkoxy, thioalkyl, acyl, aryl or substituted aryl groups, halogen, where fluorine, cyano, nitro or an optionally substituted secondary or tertiary alkylamine or arylamine represented by —N(R$^{15}$)(R$^{16}$), where R$^{15}$ and R$^{16}$ are each independently H, an optionally substituted alkyl or an optionally substituted aryl, alkoxy or polyalkoxy groups are typically employed. Further, where R$^{15}$ and R$^{16}$ is alkyl or aryl these may be optionally fluorinated.

The aforementioned aromatic rings can be fused rings or linked with a conjugated linking group such as —C(T$_1$)=C(T$_2$)—, —C≡C—, ⁻N(R''')—, —N=N—, (R''')=N—, —N=C(R''')—, where T$_1$ and T$_2$ each independently represent H, Cl, F, —C≡N or lower alkyl groups such as C$_{1-4}$ alkyl groups; R''' represents H, optionally substituted alkyl or optionally substituted aryl. Further, where R''' is alkyl or aryl it can be fluorinated.

In some OE device embodiments of the present invention, OSC materials that can be used include compounds, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons, such as, tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianaphthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; C$_{60}$ and C$_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

Further, in some embodiments in accordance with the present invention, the OSC materials are polymers or copolymers that encompass one or more repeating units selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Further p-type OSCs are copolymers comprising electron acceptor and electron donor units. Preferred copolymers of this preferred embodiment are for example copolymers comprising one or more benzo[1,2-b:4,5-b']dithiophene-2,5-diyl units that are for example 4,8-disubstituted by one or more groups R as defined above, and further comprising one or more aryl or heteroaryl units selected from Group A and Group B, which are further comprising at least one unit of Group A and at least one unit of Group B, wherein Group A consists of aryl or heteroaryl groups having electron donor properties and Group B consists of aryl or heteroaryl groups having electron acceptor properties.

Group A consists of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1",2":4,5;4",5":4',5']bis(silolo[3,2-b:3',2'-b']thiophene)-2,7-diyl, 2,7-di-thien-2-yl-indaceno[1,2-b:5,6-b']dithiophene, 2,7-di-thien-2-yl-benzo[1",2":4,5;4",5":4',5']bis(silolo[3,2-b:3',2'-b']thiophene)-2,7-diyl, and 2,7-di-thien-2-yl-phenanthro[1,10,9,8-c,d,ef,g]carbazole, all of which are optionally substituted by one or more, preferably one or two groups R as defined above.

Group B consists of benzo[2,1,3]thiadiazole-4,7-diyl, 5,6-dialkyl-benzo[2,1,3]thiadiazole-4,7-diyl, 5,6-dialkoxybenzo[2,1,3]thiadiazole-4,7-diyl, benzo[2,1,3]selenadiazole-4,7-diyl, 5,6-dialkoxy-benzo[2,1,3]selenadiazole-4,7-diyl, benzo[1,2,5]thiadiazole-4,7,diyl, benzo[1,2,5]selenadiazole-4,7,diyl, benzo[2,1,3]oxadiazole-4,7-diyl, 5,6-dialkoxy-benzo[2,1,3]oxadiazole-4,7-diyl, 2H-benzotriazole-4,7-diyl, 2,3-dicyano-1,4-phenylene, 2,5-dicyano,1,4-phenylene, 2,3-difluoro-1,4-phenylene, 2,5-difluoro-1,4-phenylene, 2,3,5,6-tetrafluoro-1,4-phenylene, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, and 3,6-pyrrolo[3,4-c]pyrrole-1,4-dione, all of which are optionally substituted by one or more, preferably one or two groups R as defined above.

In other embodiments of the present invention, the OSC materials are substituted oligoacenes such as pentacene, tetracene or anthracene, or heterocyclic derivatives thereof. Bis(trialkylsilylethynyl) oligoacenes or bis(trialkylsilylethynyl) heteroacenes, as disclosed for example in U.S. Pat. No. 6,690,029 or WO 2005/055248 A1 or U.S. Pat. No. 7,385,221, are also useful.

Where appropriate and needed to adjust the rheological properties as described for example in WO 2005/055248 A1, some embodiments of the present invention employ OSC compositions that include one or more organic binders.

The binder, which is typically a polymer, may comprise either an insulating binder or a semiconducting binder, or mixtures thereof may be referred to herein as the organic binder, the polymeric binder, or simply the binder.

Suitable binders according to the present invention are materials of low permittivity, that is, those having a permittivity c of 3.3 or less. In some embodiments the organic binder has a permittivity c of 3.0 or less, and in some other embodiments 2.9 or less. In other embodiments the organic binder has a permittivity c at of 1.7 or more. In still other embodiments the permittivity of the binder is in the range from 2.0 to 2.9. Whilst not wishing to be bound by any particular theory it is believed that the use of binders with a permittivity c of greater than 3.3, may lead to a reduction in the OSC layer mobility in an electronic device, for example an OFET. In addition, high permittivity binders could also result in increased current hysteresis of the device, which is undesirable.

Examples of a suitable organic binders include polystyrene, or polymers or copolymers of styrene and α-methyl styrene, or copolymers including styrene, α-methylstyrene and butadiene may suitably be used. Further examples of suitable binders are disclosed for example in US 2007/0102696 A1.

In some embodiments the organic binder is one in which at least 95% of the atoms, or even at least 98% of the atoms, or even all of the atoms are selected from hydrogen, fluorine and carbon atoms.

In some embodiments the binder is capable of forming a film, such as a flexible film.

The binder can also be selected from crosslinkable binders such as acrylates, epoxies, vinylethers, and thiolenes, having a sufficiently low permittivity, for example of 3.3 or less. The binder can also be mesogenic or liquid crystalline.

In other embodiments the binder is a semiconducting binder, which contains conjugated bonds, especially conjugated double bonds and/or aromatic rings. Suitable binders are for example polytriarylamines as disclosed for example in U.S. Pat. No. 6,630,566.

The proportions of binder to OSC is in some embodiments 20:1 to 1:20 by weight, in other embodiments 10:1 to 1:10, in still other embodiments 5:1 to 1:5, in still other embodiments 3:1 to 1:3, in still other embodiments 2:1 to 1:2 and especially 1:1. Dilution of the compound of formula I in the binder has been found to have little or no detrimental effect on the charge mobility, in contrast to what would have been expected from the prior art.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the features of the invention are applicable to all aspects of the invention and may be used in any combination. Likewise, features described in non-essential combinations may be used separately (not in combination).

The invention will now be described in more detail by reference to the following examples, which are illustrative only and do not limit the scope of the invention.

Above and below, unless stated otherwise percentages are percent by weight and temperatures are given in degrees Celsius (° C.). The values of the dielectric constant ε ("permittivity") refer to values taken at 20° C. and 1,000 Hz.

Examples 1-3

Bank Structure Polymer in a Bottom Gate Organic Transistor Device

A substrate of Corning Eagle XG glass is sonicated in 3% Decon 90 for 30 min at 70° C., washed twice with water and sonicated in MeOH, then dried by spin off on the spin coater.

A 30 nm aluminium layer is then thermally evaporated onto the substrate through a shadow mask to form the gate electrode. Lisicon D207® dielectric is coated and processed according to the description (available from Merck KGaA, Darmstadt, Germany). The substrate with gate electrode and dielectric is then further used for preparing a bottom gate OFET device as described hereinafter in Examples 1, 2 and 3, respectively.

Example 1

Silver source and drain electrodes of 30 nm thickness are thermally evaporated through a shadow mask onto the substrate, creating a channel with a length L=50 μm and a width W=1000 μm.

Then a 15% solution of a copolymer of $NBC_4F_9$ and DMMIBuNB, ratio of co-monomers 52/48, $M_w$ 83,400, in MAK is spun onto the substrate at 1500 rpm creating a film with a thickness of 500 nm.

Figure 3:
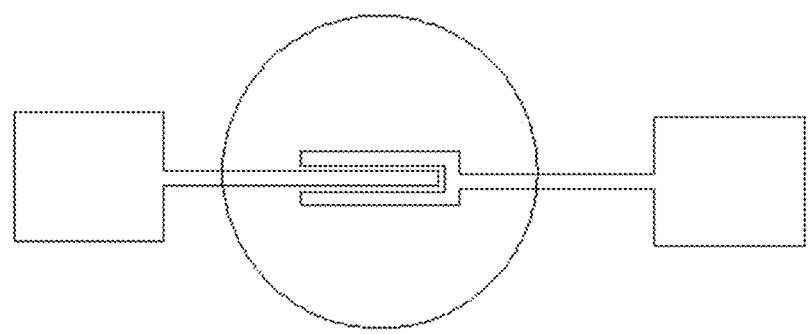
FIG. 3 is a schematic representation of a bank structure pattern in an OFET device of Example 1, 2 and 4.

Then the substrate is illuminated at 365 nm for 8s through a mask using a KarlSuss mask aligner. The unexposed part of the film has a shape of a circle with a diameter of 1.1 mm located in relation to the position of source/drain electrodes, as schematically illustrated in FIG. 3.

Then the pattern is developed for 1 minute in mixture THF-IPA (1:1), washed with IPA and dried by spin-drying. Next the substrate is flood-illuminated for 1 min at 365 nm (11 mW/cm²).

After creating the bank structures, the substrate is treated with the surface treatment formulation Lisicon M0010 (Merck KGaA, Darmstadt, Germany) for 1 min, washed with isopropyl alcohol and dried by spin off on the spin coater. Next the OSC Formulation Lisicon S1200® (Merck KGaA, Darmstadt, Germany) is spun onto the substrate after above treatment and then annealed for 1 min at 100° C. on a hot plate.

Figure 5:
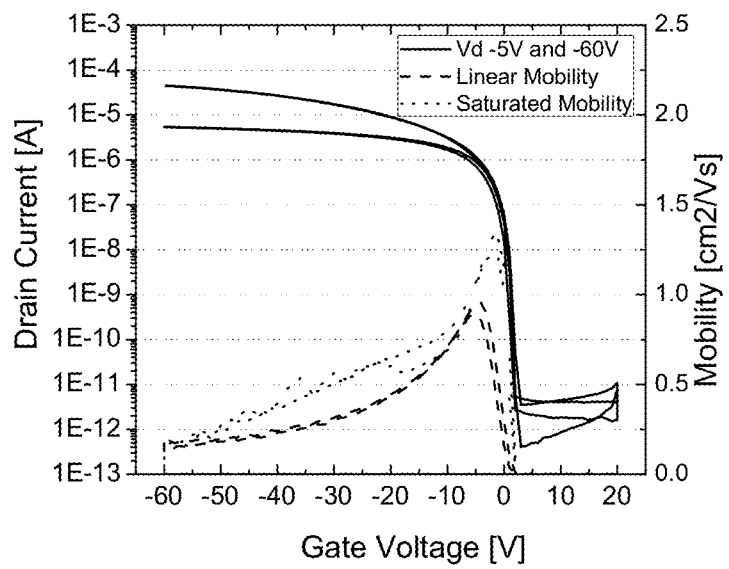
FIG. 5 is a transfer curve of a bottom gate OFET device of Example 1.

The transfer characteristics for the bottom gate OFET device is shown in FIG. 5. It can be seen that drain current in the off state is very low.

Example 2

A 15% solution of a copolymer of $NBC_4F_9$ and DMMIBuNB, ratio of co-monomers 36/64, $M_w$ 118,000, in MAK is spun onto the substrate at 1500 rpm creating a film with a thickness of 500 nm.

Then the substrate is illuminated at 365 nm for 8s through a mask using a KarlSuss mask aligner. The unexposed part of the film has the shape of a circle with a diameter of 1.1 mm located in relation to the position of source/drain electrodes as schematically illustrated in FIG. 3.

Then the pattern is developed for 1 minute in mixture THF-IPA (1:1), washed with IPA and dried by spin-drying. Next the substrate is flood-illuminated for 1 min at 365 nm (11 mW/cm²).

After creating the bank structures, silver source and drain electrodes of 30 nm thickness are thermally evaporated through a shadow mask onto the substrate, creating a channel with a length L=50 μm and a width W=1000 μm.

Then substrate is treated with the surface treatment formulation Lisicon M001® for 1 min, washed with isopropyl alcohol and dried by spin off on the spin coater. Next the OSC Formulation Lisicon S1200® is spun onto the substrate after above treatment and then annealed for 1 min at 100° C. on a hotplate.

Figure 6:
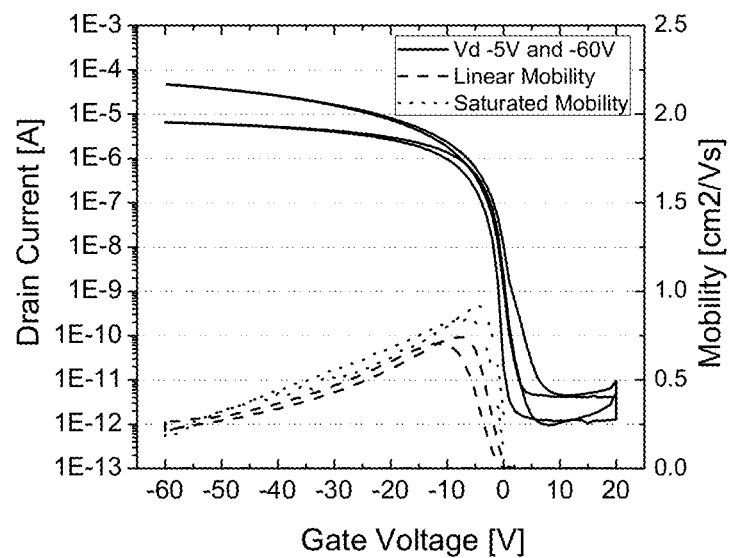
FIG. 6 is a transfer curve of a bottom gate OFET device of Example 2.

The transfer characteristics for the bottom gate OFET device is shown in FIG. 6. It can be seen that drain current in the off state is very low.

Example 3

Silver source and drain electrodes of 30 nm thickness are thermally evaporated through a shadow mask onto the substrate, creating a channel with a length L=50 μm and a width W=1000 μm.

Figure 4:
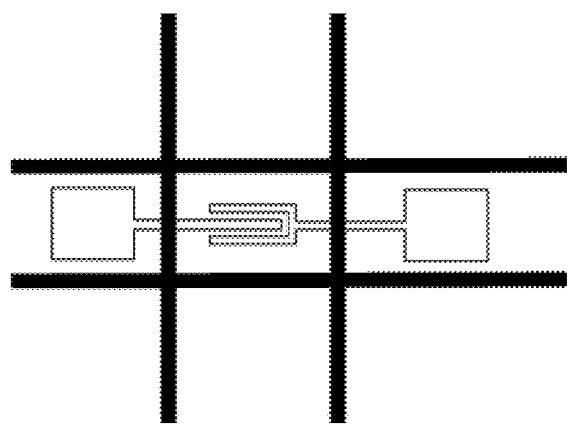
FIG. 4 is a schematic representation of a bank structure pattern in an OFET device of Example 3.

A 7.5% solution of a copolymer of $NBC_4F_9$ and DMMIBuNB, ratio of co-monomers 36/64, $M_w$ 118,000, in decanone, is ink-jetted on the substrate that was heated to 50° C. substrate using a Diamatix ink-jet printer creating the pattern in relation to the position of source/drain electrodes as schematically illustrated in FIG. 4. Next the substrate is flood-illuminated for 1 min at 365 nm (11 mW/cm²).

After creating the bank structures, the OSC Formulation Lisicon 51200® is spun onto the substrate after above treatment and then annealed for 1 min at 100° C. on a hot plate.

Figure 7:
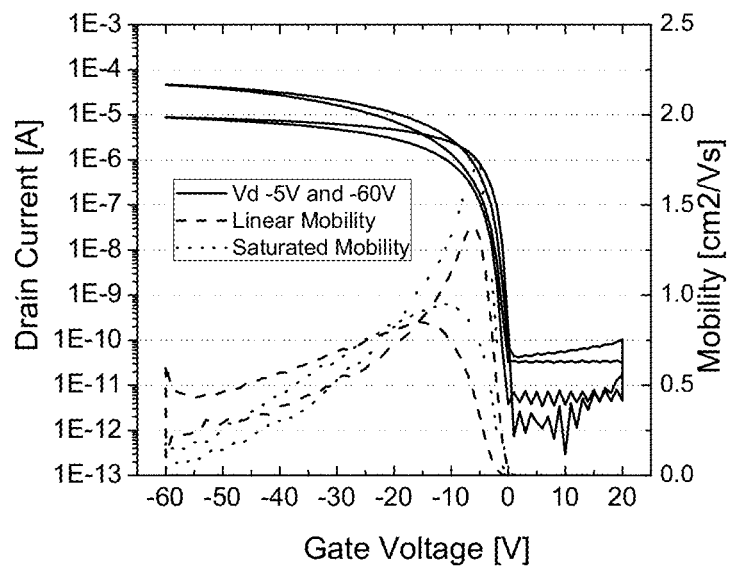
FIG. 7 is a transfer curve of a bottom gate OFET device of Example 3.

The transfer characteristics for the bottom gate OFET device is shown in FIG. 7. It can be seen that drain current in the off state is very low.

Comparison Example 1

A bottom gate OFET device is prepared as described in Example 1, but without the bank structures.

Figure 8:
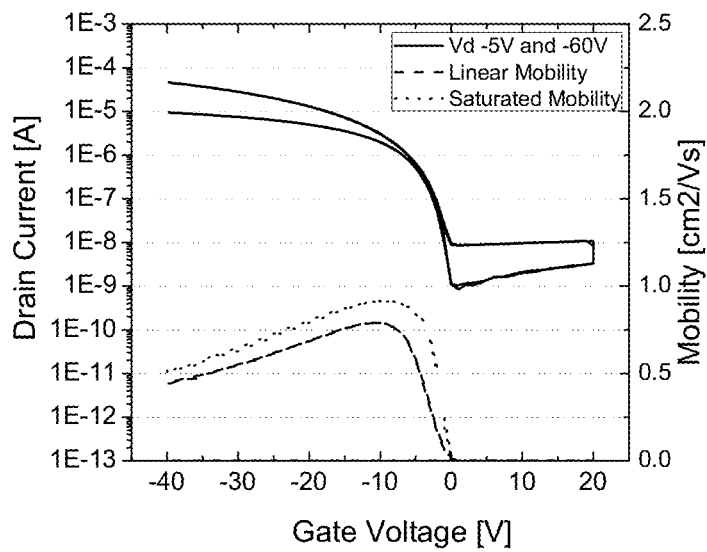
FIG. 8 is a transfer curve of a bottom gate OFET device of Comparison Example 1.

The transfer characteristics for the bottom gate OFET device is shown in FIG. 8. It can be seen that drain current in the off state is significantly higher than in the devices with bank structures applied.

Example 4

Bank Structure Polymer in a Top Gate Organic Transistor Device

A top gate OFET is prepared as follows. A substrate of Corning 1737 glass is sonicated in 3% Decon 90 for 30 min at 70° C., washed twice with water and sonicated in MeOH, then dried by spin off on the spin coater. Gold source and drain electrodes of 30 nm thickness are thermally evaporated through a shadow mask onto the substrate, creating a channel with a length L=50 μm and width W=1000 μm. The substrate is treated with the surface treatment formulation Lisicon M0010 for 1 min, washed with isopropyl alcohol and dried by spin off on the spin coater.

A 15% solution of a copolymer of $NBC_4F_9$ and DMMIBuNB, ratio of co-monomers 44/56, $M_w$ 83,200, in MAK is spun at 1500 rpm onto the substrate creating a film with a thickness of 500 nm.

Then the substrate is illuminated at 365 nm for 1s through a mask using a KarlSuss mask aligner. The unexposed part of the film has the shape of a circle with a diameter of 1.1 mm located in relation to the position of source/drain electrodes as schematically illustrated in FIG. 3.

Then the pattern is developed for 1 minute in cyclohexanone washed with IPA and dried by spin-drying.

After creating the bank structures, the OSC Formulation Lisicon 51200® is spun onto the substrate and then annealed for 1 min at 100° C. on a hot plate. Then Lisicon D139® dielectric (Merck KGaA, Darmstadt, Germany) is spun and annealed at 100° C. on a hot plate for 2 minutes. Next silver is evaporated as the gate electrode by the use of a shadow mask.

Figure 9:
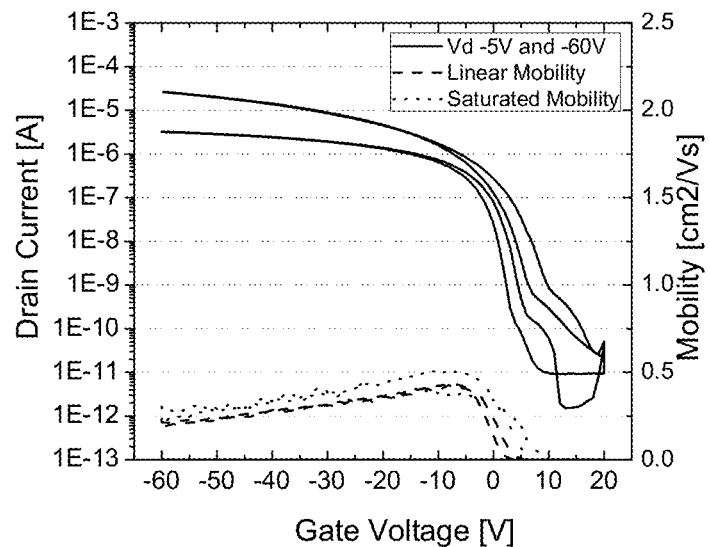
FIG. 9 is a transfer curve of a top gate OFET device of Example 4.

The transfer characteristics for the bottom gate OFET device is shown in FIG. 9. It can be seen that drain current in the off state is very low.

Comparison Example 2

A top gate OFET device is prepared as described in Example 4, but without the bank structures.

Figure 10:
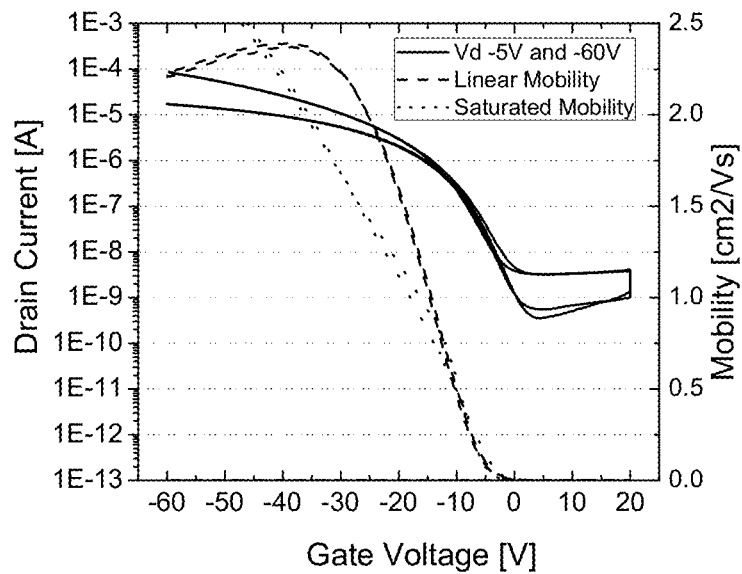
FIG. 10 is a transfer curve of a top gate OFET device of Comparison Example 2.

The transfer characteristics for the bottom gate OFET device is shown in FIG. 10. It can be seen that drain current in the off state is significantly higher than in the devices with bank structures applied.

Example 5

Photo Patterned Bank Structure Polymer Material in an OLED Device

A copolymer of DMMIMeNB and PPVENB, ratio of co-monomers 54/46, $M_w$=49,000, was used for this evaluation.

A solution of the copolymer was prepared by dissolving it in MAK at a concentration of 20% (w/w). The photoinitiator CPTX (1-chloro-4-propoxy-9H-thioxanthen-9-one from Aldrich) was added at 1.5% (w/w) of the copolymer. The resultant solution was filtered using a 0.45µ filter.

Glass substrates (Corning XG glass) were cleaned prior to application of the photoresist by sonication for 5 minutes in methanol at 50° C. The substrate was dried by passing compressed air over and then placing on a hotplate at 150° C. for 5 minutes.

The copolymer solution was then spin coated onto the glass substrate at a spin speed of 1000 rpm for a period of 30 seconds. The coated substrate was then baked on a hot plate for 20 seconds at a temperature of 120° C. The substrate was then placed in the mask aligner and exposed to UV light utilising a 365 nm filter for 10 seconds. The resultant structure was then developed by dipping the slide without agitation into first 2-heptanone for a period of 70 seconds, this is then removed and spin dried at a speed of 1000 rpm for 30 seconds. This process is repeated using PGMEA as the developing solvent.

Figure 11A:
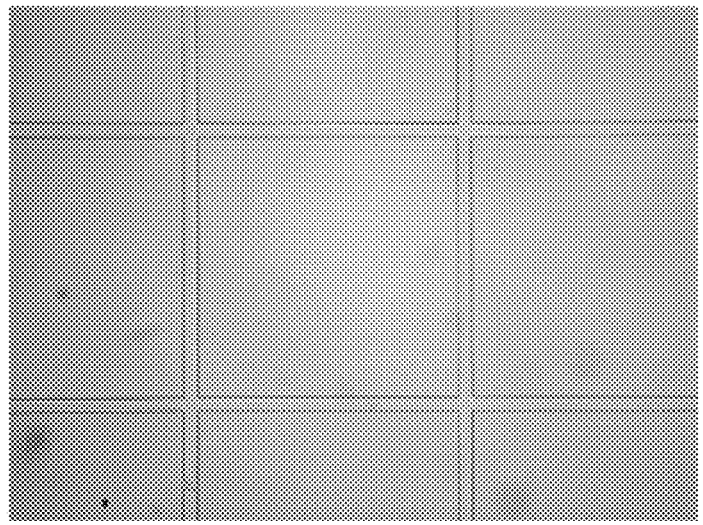
FIGS. 11a and 11b are images of photopatterned bank structures used in the preparation of an OLED device of Example 5.

An image of the photo resist wherein the size of the squares is 2 mm×2 mm, is shown in FIG. 11a.

Figure 11B:
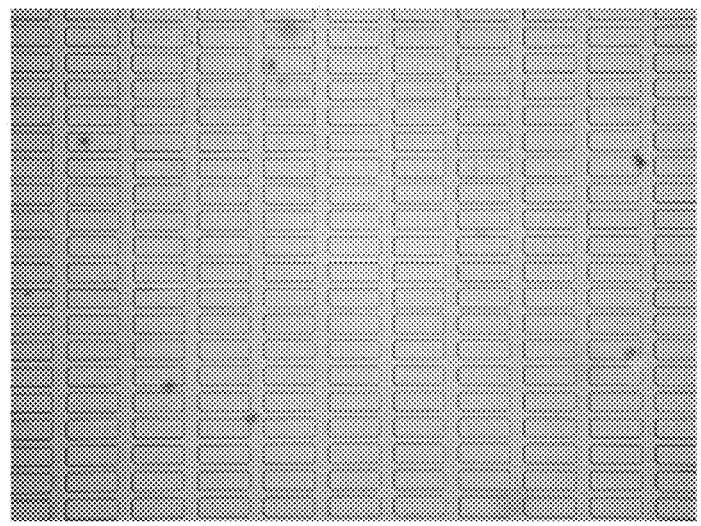

An image of the photo resist, wherein the size of the pixels are 250µ×75µ, is shown in FIG. 11b.

An ink TSG-003 (supplied by Merck KGaA) was printed into this pixel using a Dimatix DMP2800 series ink-jet printer. An LCP (Liquid Crystal Polymer) cartridge was used, ink jet conditions were nozzle temperature 25° C., platen temperature 35° C., drop spacing 15µ.

Figure 12A:
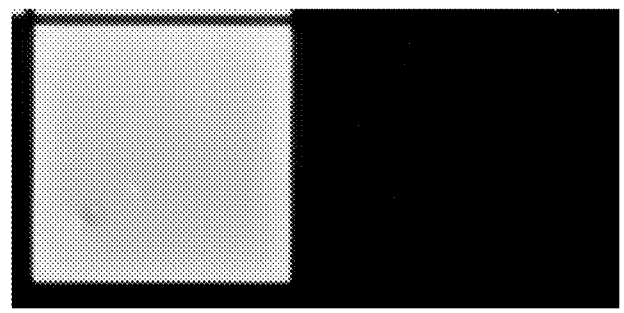
FIGS. 12a and 12b show photomicrographs of an OLED ink printed into the photopatterned bank structures in an OLED device of Example 5.
Figure 12B:
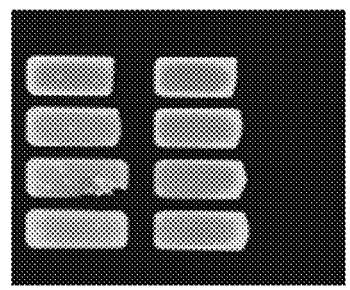

FIGS. 12a and 12b show photomicrographs taken using a UV light source. It can be seen that good film formation is obtained, and the ink is contained within the pixelated structure. It is also observed that the ink does not wet the bank structure material.

Example 6

Ink-Jet Patterned Bank Structure Polymer Material in an OLED Device

A copolymer of DMMIBuNB and NBC$_4$F$_9$, co-monomer ratio 64/36, $M_w$ 102,000, was used for this evaluation.

A solution of the copolymer was prepared by dissolving it in 3-decanone at a concentration of 7.5% (w/w). No initiator is required for this material. The resultant solution was filtered using a 0.45µ filter.

ITO coated glass substrates were cleaned prior to application of the photoresist by sonication for 10 minutes using 3% Decon 90 solution. After sonication this is washed with 6 times with water and then sonicated for 5 minutes in water, substrate is then dried and then sonicated in methanol for 5 minutes; all sonications were performed at 60° C. The substrate was dried by passing compressed air over and then placing on a hot plate at 150° C. for 5 minutes.

The copolymer solution was printed onto the cleaned substrate using a Dimatix DMP2800 series ink-jet printer. An LCP (Liquid Crystal Polymer) cartridge was used, ink jet conditions were nozzle temperature 25° C., platen temperature 60° C. drop spacing 30 g. After this the material was cured using a 365 nm UV lamp for a duration of 1 minute.

Figure 13:
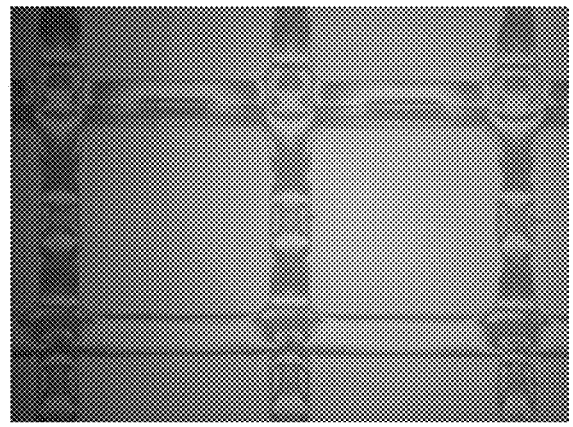
FIG. 13 is an image of an ink-jet patterned bank structure used in the preparation of an OLED device of Example 6.

FIG. 13 shows an image of the ink-jetted bank structures, the wall width is approximately 250µ with an internal pixel dimension of approximately 1 mm×1 mm the pattern is made up from individual squares, as a consequence the lines do not always merge together forming small holes between the walls of each bank. This effect can be seen in the photoluminescent image.

An ink TSG-003 (supplied by Merck KGaA) was printed into this pixel using a Dimatix DMP2800 series ink-jet printer. An LCP (Liquid Crystal Polymer) cartridge was used, ink jet conditions were nozzle temperature 25° C., platen temperature 25° C. drop spacing 15µ.

Figure 14:
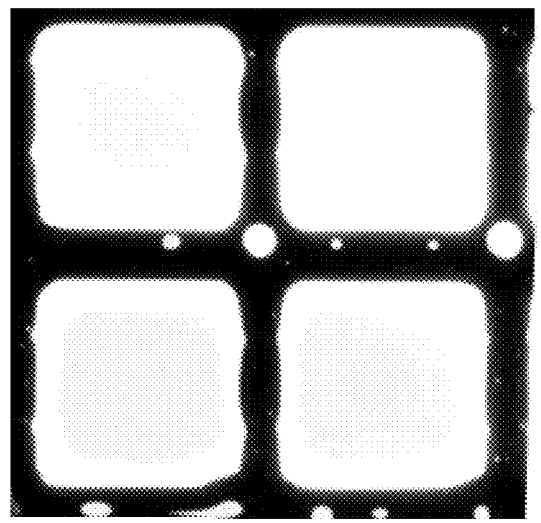
FIG. 14 is a photomicrograph of an OLED ink printed into the photopatterned bank structures in an OLED device of Example 6.

FIG. 14 shows a photomicrograph taken using a UV light source. It can be seen that the printed bank structure contains the ink well and uniform film formation is seen. As squares were printed there are areas between the squares where the bank structure material did not meet forming small islands between the neighboring pixels, these can be seen as white dots between the squares.

What is claimed is:

1. An organic electronic device comprising a substrate in contact with one or more bank structures, wherein said bank structures comprise a polycycloolefinic polymer that includes one or more distinct types of repeating units of formula I

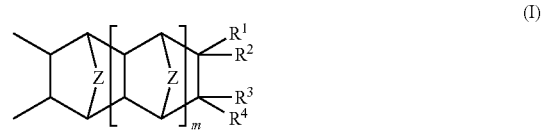

wherein Z is selected from —CH$_2$—, —CH$_2$—CH$_2$— or —O—, m is an integer from 0 to 5, each of R$^1$, R$^2$, R$^3$ and R$^4$ are independently selected from H, a C$_1$ to C$_{25}$ hydrocarbyl, a C$_1$ to C$_{25}$ halohydrocarbyl or a C$_1$ to C$_{25}$ perhalocarbyl group, wherein the substrate has a higher surface energy than the one or more bank structures that include the polycycloolefinic polymer.

2. The organic electronic device of claim 1, wherein the polycycloolefinic polymer is a copolymer comprising two or more distinct types of repeating units.

3. The organic electronic device of claim 1, wherein the polycycloolefinic polymer comprises a repeating unit having a pendent crosslinkable group.

4. The organic electronic device of claim 3, wherein the pendent crosslinkable group comprises a substituted or unsubstituted maleimide portion, an epoxide portion, a vinyl portion, an acetylene portion, an indenyl portion, a cinnamate portion or a coumarin portion.

5. The organic electronic device of claim 4, wherein the repeating unit having a pendent crosslinkable group is derived during polymerization from one of the following monomers:

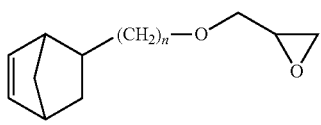

P1

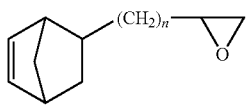

P2

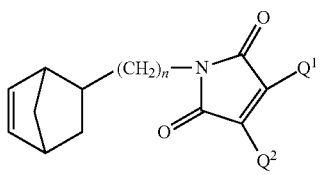

P3

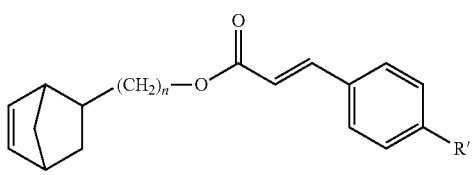

P4

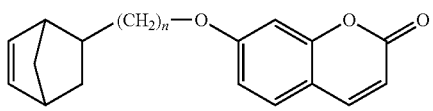

P5 where n is an integer from 1 to 8, $Q^1$ and $Q^2$ are each independently of one another —H or —CH$_3$, and R' is —H or —OCH$_3$.

6. The organic electronic device of claim 1, wherein the polycycloolefinic polymer comprises one or more repeating units from norbornene-type monomers independently selected from the following formulae:

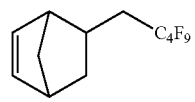  NBC$_4$F$_9$  15

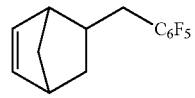  NBCH$_2$C$_6$F$_5$  16

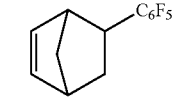  NBC$_6$F$_5$  17

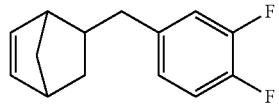 [SMILES: Fc1ccc(CC2CC3C=CC2C3)cc1F]  NBCH$_2$C$_6$H$_3$F$_2$  18

-continued

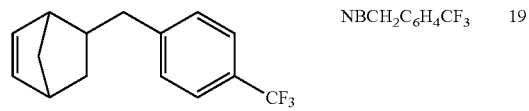  NBCH$_2$C$_6$H$_4$CF$_3$  19

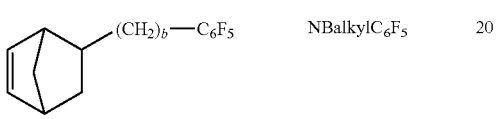  NBalkylC$_6$F$_5$  20

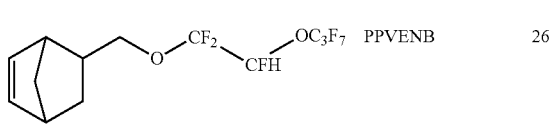  PPVENB  26 wherein b is an integer from 1 to 6.

7. The organic electronic device of claim 6, wherein the polycycloolefinic copolymer further comprises one or more repeating units from norbornene-type monomers independently selected from the following formulae:

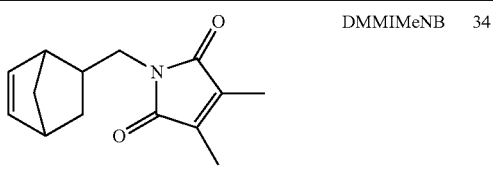  DMMIMeNB  34

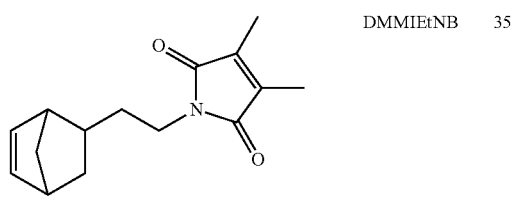  DMMIEtNB  35

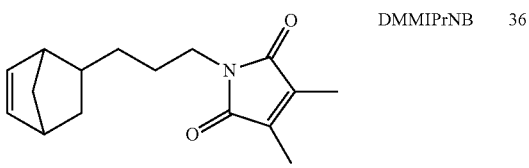  DMMIPrNB  36

  DMMIBuNB  37

-continued

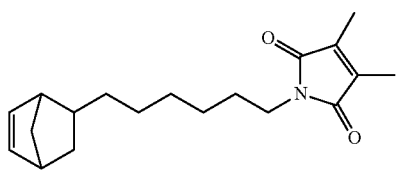 [SMILES: CC1=C(C)C(=O)N(CCCCCCC2CC3C=CC2C3)C1=O]
DMMIHxNB  38.

8. The organic electronic device of claim 7, wherein the polycycloolefinic copolymer comprises units of the formula 15

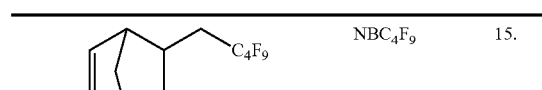
NBC$_4$F$_9$  15.

9. The organic electronic device of claim 1, wherein the polycycloolefinic polymer comprises one or more repeating units from norbornene-type monomers independently selected from the following formulae:

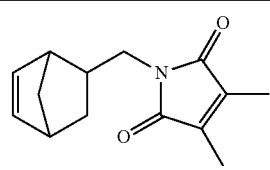
DMMIMeNB  34

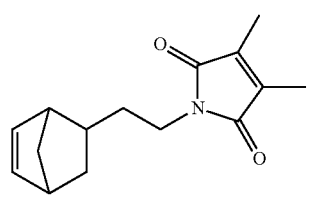 [SMILES: CC1=C(C)C(=O)N(CCC2CC3C=CC2C3)C1=O]
DMMIEtNB  35

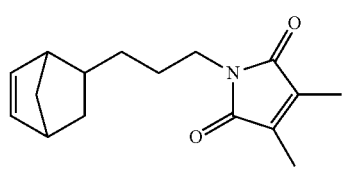 [SMILES: CC1=C(C)C(=O)N(CCCC2CC3C=CC2C3)C1=O]
DMMIPrNB  36

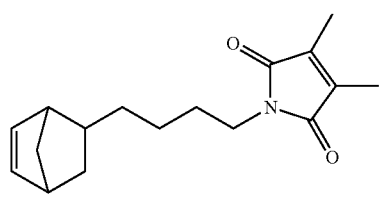 [SMILES: CC1=C(C)C(=O)N(CCCCC2CC3C=CC2C3)C1=O]
DMMIBuNB  37

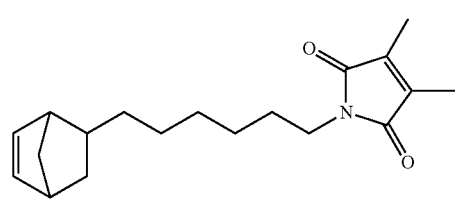 [SMILES: CC1=C(C)C(=O)N(CCCCCCC2CC3C=CC2C3)C1=O]
DMMIHxNB  38.

10. The organic electronic device of claim 1, wherein the bank structures are derived from a polymer composition comprising one or more of a solvent, a crosslinking agent, an optional reactive solvent, a stabilizer, a UV sensitizer, an adhesion promoter, and a thermal sensitizer.

11. The organic electronic device of claim 1, wherein the polymer composition comprises a crosslinking agent selected of formula III1 or III2

$$P\text{-}A''\text{-}X'\text{-}A''\text{-}P \qquad \text{III1}$$

$$H_{4-c}C(A''\text{-}P)_c \qquad \text{III2}$$

wherein X' is O, S, NH or a single bond, A" is a single bond or a connecting, spacer or bridging group selected from $(CZ_2)_n$, $(CH_2)_n\text{—}(CH\text{=}CH)_p\text{—}(CH_2)_n$, $(CH_2)_n\text{—}O\text{—}(CH_2)_n$, $(CH_2)_n\text{—}C_6Q_{10}\text{-}(CH_2)_n$, and C(O), where each n is independently an integer from 0 to 12, p is an integer from 1-6, Z is independently H or F, $C_6Q_{10}$ is cyclohexyl that is substituted with Q, Q is independently H, F, $CH_3$, $CF_3$ or $OCH_3$, P is a latent crosslinkable group and c is 2, 3 or 4, and where in formula III1 at least one of X' and the two groups A" is not a single bond.

12. The organic electronic device of claim 11, wherein the compound of formula III1 is selected of formula C1

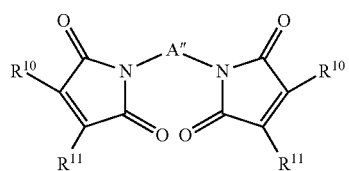

wherein $R^{10}$ and $R^{11}$ are independently of each other H or a $C_1$-$C_6$ alkyl group and A" is as defined in claim 11.

13. The organic electronic device of claim 1, wherein the polymer composition comprises a crosslinking agent of formula IV $$G^1\text{-}A''\text{-}G^2 \qquad \text{IV}$$

wherein $G^1$ is a surface active group, A" is a single bond or a connecting, spacer or bridging group, and $G^2$ is a crosslinkable group or a non-reactive compatibilizing group.

14. The organic electronic device of claim 13, wherein $G^1$ is a surface-active group of the formula —$SiR^{12}R^{13}R^{14}$, or a group of the formula —NH—$SiR^{12}R^{13}R^{14}$, wherein $R^{12}$, $R^{13}$ and $R^{14}$ are each independently selected from halogen, silazane, $C_1$-$C_{12}$-alkoxy, $C_1$-$C_{12}$-alkylamino, optionally substituted $C_5$-$C_{20}$-aryloxy and optionally substituted $C_2$-$C_{20}$-heteroaryloxy, and wherein one or two of $R^{12}$, $R^{13}$ and $R^{14}$ may also denote $C_1$-$C_{12}$-alkyl, optionally substituted $C_5$-$C_{20}$-aryl or optionally substituted $C_2$-$C_{20}$-heteroaryl, $G^2$ is a crosslinkable group selected from a maleimide, a 3-monoalkyl-maleimide, a 3,4-dialkylmaleimide, an epoxy, a vinyl, an acetyl, an indenyl, a cinnamate or a coumarin group, or comprises a substituted or unsubstituted maleimide portion, an epoxide portion, a vinyl portion, an acetylene portion, an indenyl portion, a cinnamate portion or a coumarin portion, and A" is a single bond or a connecting, spacer or bridging group selected from $(CZ_2)_n$, $(CH_2)_n\text{—}(CH\text{=}CH)_p\text{—}(CH_2)_n$, $(CH_2)_n\text{—}O$, $(CH_2)_n\text{—}O\text{—}(CH_2)_n$, $(CH_2)_n\text{—}C_6Q_4\text{-}(CH_2)_n$, $(CH_2)_n\text{—}C_6Q_{10}\text{-}(CH_2)_n$ and C(O)—O, where each n is independently an integer from 0 to 12, p is an integer from 1-6, Z is independently H or F, $C_6Q_4$ is phenyl that is substituted with Q, $C_6Q_{10}$ is cyclohexyl that is substituted with Q, Q is independently H, F, $CH_3$, $CF_3$ or $OCH_3$.

15. The organic electronic device of claim 14, wherein the compound of formula IV is selected of formula A1:

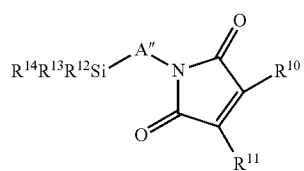

where $R^{12}$, $R^{13}$, $R^{14}$, and A" are as defined in claim 14, and $R^{10}$ and $R^{11}$ are each independently H or a $C_1$-$C_6$ alkyl group.

16. The organic electronic device of claim 1, which is an Organic Field Effect Transistor (OFET), Organic Thin Film Transistor (OTFT), Organic Light Emitting Diode (OLED) or Organic Photovoltaic (OPV) device.

17. The organic electronic device of claim 16, which is a top gate OFET or bottom gate OFET.

18. The organic electronic device of claim 17, which comprises a substrate, a gate electrode, a dielectric layer serving as gate insulator, source and drain electrodes that are spaced apart with a channel region located therebetween, first and second bank structures that are patterned such that they define a well that extends over the channel region, and an OSC layer provided in the channel region, wherein the bank structures are derived from a polycycloolefinic polymer or said polymer composition.

19. A process for preparing the organic electronic device of claim 18, which comprise:
  a) forming gate electrode on a substrate,
  b) depositing a layer of dielectric material on the gate electrode,
  c) forming source and drain electrodes on the dielectric layer such that they are spaced apart with a channel region located therebetween,
  d) forming bank structures by depositing a bank structure material comprising a polycycloolefinic polymer or said polymer composition on the source and drain electrodes, thereby defining a well that extends over the channel region, and
  e) depositing a layer of semiconductor material in the well formed by the bank structures and onto the source and drain electrodes.

20. The organic electronic device of claim 17, which comprises a substrate, source and drain electrodes that are spaced apart with a channel region located therebetween, first and second bank structures that are patterned such that they define a well that extends over the channel region, an OSC layer provided in the channel region, a dielectric layer serving as gate insulator, and gate electrode, wherein the bank structures are derived from a polycycloolefinic polymer or said polymer composition.

21. A process for preparing the organic electronic device of claim 20, which comprise:
  a) forming source and drain electrodes on a substrate such that they are spaced apart with a channel region located therebetween,
  b) forming bank structures by depositing a bank structure material comprising a polycycloolefinic polymer or said polymer composition on the source and drain electrode, thereby defining a well that extends over the channel region, c) depositing a layer of semiconductor material in the well formed by the bank structures and onto the source and drain electrodes, d) depositing a layer of dielectric material on the semiconductor layer, and e) forming gate electrode on the dielectric layer.

22. The organic electronic device according to claim 16, which comprises one or more electrodes that are spaced apart to define a channel region located therebetween, and the bank structures are provided such that they are overlying said electrodes and define a well or a pattern of wells into which an organic semiconducting layer is deposited, so that the bank structures are contacting said electrodes and said organic semiconducting layer.

23. The organic electronic device of claim 1, wherein the bank structures are formed as single layers comprising a polycycloolefinic polymer.

24. A product or assembly comprising the organic electronic device according to claim 1, which is an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a sensor, a biosensor or a biochip.

25. A bank structure in an organic electronic device comprising a polycycloolefinic polymer that includes one or more distinct types of repeating units of formula I

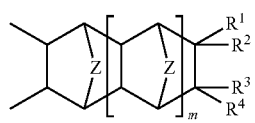

(I)

wherein Z is selected from —$CH_2$—, —$CH_2$—$CH_2$— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group, and the bank structure is in contact with a substrate that has a higher surface energy than the bank structure that includes the polycycloolefinic polymer.

26. The bank structure of claim 25 wherein the organic electronic device is an Organic Field Effect Transistor (OFET), Organic Thin Film Transistor (OTFT), Organic Light Emitting Diode (OLED) or Organic Photovoltaic (OPV) device.

27. The bank structure of claim 25, wherein the polycycloolefinic polymer is a polycycloolefinic copolymer comprising one or more repeating units from norbornene-type monomers independently selected from the following formulae:

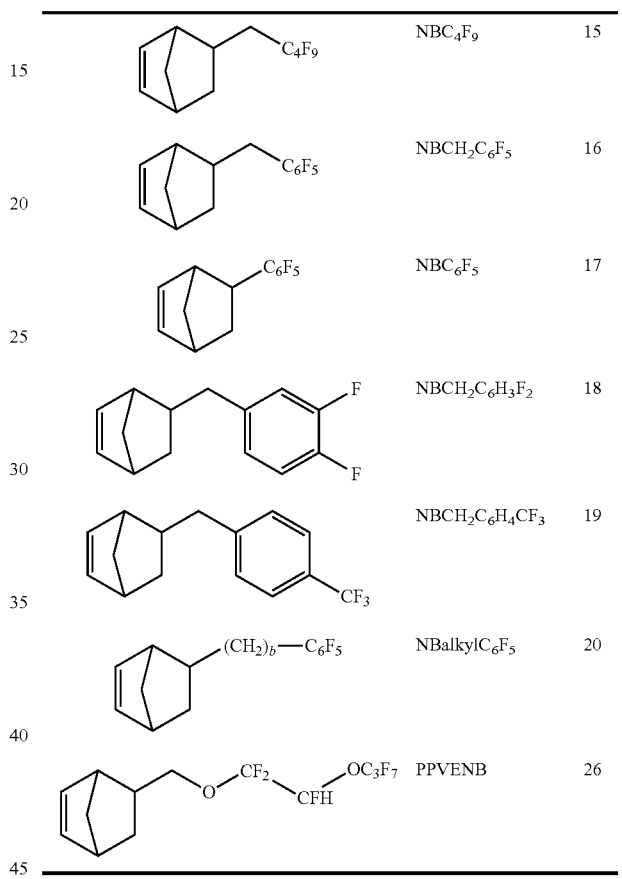

wherein b is an integer from 1 to 6, and one or more repeating units from norbornene-type monomers independently selected from the following formulae:

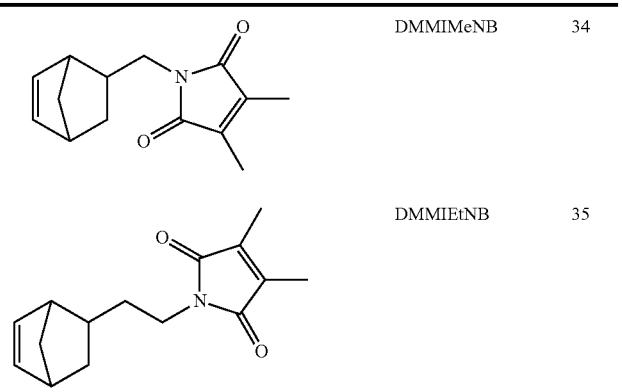

-continued
| | | |
|---|---|---|
| 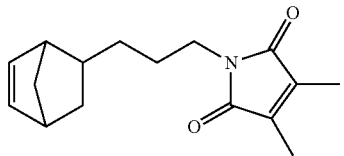 [SMILES: CC1=C(C)C(=O)N(CCCC2CC3C=CC2C3)C1=O] | DMMIPrNB | 36 |
| 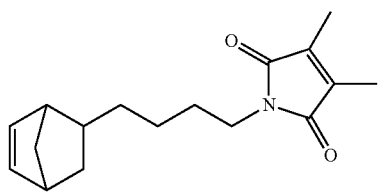 [SMILES: CC1=C(C)C(=O)N(CCCCC2CC3C=CC2C3)C1=O] | DMMIBuNB | 37 |
| 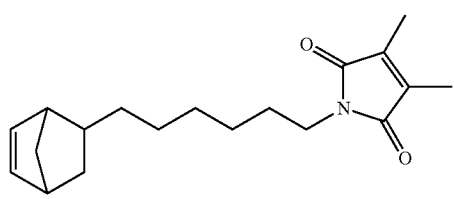 [SMILES: CC1=C(C)C(=O)N(CCCCCCC2CC3C=CC2C3)C1=O] | DMMIHxNB | 38. |
* * * * *